US011613432B2

(12) United States Patent
Moyama et al.

(10) Patent No.: US 11,613,432 B2
(45) Date of Patent: Mar. 28, 2023

(54) PROCESSING SYSTEM AND METHOD USING TRANSPORTING DEVICE FACILITATING REPLACEMENT OF CONSUMABLE PART

(71) Applicant: TOKYO ELECTRON LIMITED, Tokyo (JP)

(72) Inventors: Kazuki Moyama, Miyagi (JP); Kazuya Nagaseki, Miyagi (JP); Toshiya Matsuda, Fuchu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 213 days.

(21) Appl. No.: 17/186,932

(22) Filed: Feb. 26, 2021

(65) Prior Publication Data
US 2021/0269258 A1    Sep. 2, 2021

(30) Foreign Application Priority Data

Feb. 28, 2020  (JP) .............................. JP2020-032567

(51) Int. Cl.
*H01L 21/67*   (2006.01)
*B65G 47/90*   (2006.01)
*B23P 6/00*    (2006.01)
*G05B 23/02*   (2006.01)

(52) U.S. Cl.
CPC .............. *B65G 47/905* (2013.01); *B23P 6/00* (2013.01); *G05B 23/0283* (2013.01); *H01L 21/67276* (2013.01)

(58) Field of Classification Search
None
See application file for complete search history.

(56) References Cited

U.S. PATENT DOCUMENTS 5,803,932 A * 9/1998 Akimoto ........... H01L 21/67184
                                              118/500
6,035,245 A * 3/2000 Conboy ................. G06Q 10/08
                                              700/214
6,315,512 B1 * 11/2001 Tabrizi .............. H01L 21/67781
                                              414/217

(Continued)

FOREIGN PATENT DOCUMENTS

JP           2017-85072 A      5/2017

*Primary Examiner* — Bernard G Lindsay
(74) *Attorney, Agent, or Firm* — Weihrouch IP

(57) ABSTRACT

A method includes estimating a replacement time of a consumable part of a processing device, specifying a timing after substrate processing of the processing device is completed in a period before the replacement time as a replaceable timing of the consumable part, estimating a movement time period required for the part transporting device to move to a position of the processing device requiring the replacement, and estimating a preparation time period required for preparation until the part transporting device moved to the position of the processing device requiring the replacement becomes a state in which the consumable part is replaceable. The method further includes transmitting a replacement instruction to the part transporting device at a timing before a timing that is earlier than the replaceable timing by a total time of the movement time period and the preparation time period, and instructing the replacement of the consumable part.

14 Claims, 23 Drawing Sheets

(56) References Cited

U.S. PATENT DOCUMENTS

| | | | |
|---|---|---|---|
| 2013/0190915 A1* | 7/2013 | Choo | G05B 19/4189 |
| | | | 700/113 |
| 2016/0004244 A1* | 1/2016 | Huang | G05B 19/4189 |
| | | | 700/113 |
| 2017/0113355 A1* | 4/2017 | Genetti | H01L 21/6719 |
| 2017/0115657 A1 | 4/2017 | Trussell et al. | |
| 2017/0117172 A1* | 4/2017 | Genetti | H01L 21/67386 |

* cited by examiner

FIG.14

| PART ID | PROCESSING DEVICE ID | REPLACEMENT DATE AND TIME | RF INTEGRATION TIME | NEXT REPLACEMENT TIME | PART TRANSPORTING DEVICE ID |
|---|---|---|---|---|---|
| PA001 | PM001 | 2019/11/30 12:41 | 213:51 | 2019/12/20 15:56 | PC001 |
| PA002 | PM002 | 2019/12/16 08:09 | 132:48 | 2019/12/26 09:27 | – |
| ... | ... | ... | ... | ... | ... |

210

US 11,613,432 B2

PROCESSING SYSTEM AND METHOD USING TRANSPORTING DEVICE FACILITATING REPLACEMENT OF CONSUMABLE PART

CROSS-REFERENCE TO RELATED APPLICATIONS

This application claims priority to Japanese Patent Application No. 2020-032567, filed on Feb. 28, 2020, the entire contents of which are incorporated herein by reference.

TECHNICAL FIELD

Exemplary embodiments of the present disclosure relate to a processing system and a part replacement method.

BACKGROUND

Inside a processing device for processing a substrate, there is a consumable part that is consumed as the substrate is processed. The consumable part is replaced with an unused consumable part when a consumption amount is larger than a predetermined consumption amount. In the replacement of the consumable part, processing of the substrate in the processing device is stopped, and a container of the processing device is opened to the atmosphere. Then, a used consumable part is manually extracted, and an unused consumable part is mounted. Then, the container is closed, the inside of the container is evacuated, and the processing of the substrate is restarted.

As described above, when the consumable part is replaced, the inside of the processing device is opened to the atmosphere. Accordingly, it is necessary to evacuate the inside of the processing device after the consumable part is replaced, and thus a processing stop time period becomes longer. Further, since some of the consumable parts are large parts, it may take time to replace the parts manually.

In order to avoid this, there is known a replacement station having a replacement handler for replacing the consumable part with the unused consumable part (see, e.g., Japanese Patent Application Publication No. 2017-85072). In the replacement station, a processing device and the replacement station are connected to each other, and a shutoff valve between the processing device and the replacement station is opened after the inside of the replacement station is evacuated. Then, the used consumable part is extracted from the inside of the processing device by the replacement handler in the replacement station and is replaced with the unused consumable part mounted in the replacement station. As a result, the consumable part may be replaced without opening the inside of the processing device to the atmosphere, and thus, the processing stop time period may be shortened. Further, since the consumable part is replaced by the replacement handler instead of being replaced manually, the consumable part may be replaced in a short period of time.

SUMMARY

The present disclosure provides a processing system and a part replacement method capable of shortening a downtime of a processing device caused by the replacement of a consumable part.

In accordance with an aspect of the present disclosure, there is provided a processing system including: a processing device configured to process a substrate; a part transporting device configured to transport a consumable part provided in the processing device; and a control device configured to control the processing device and the part transporting device. The control device executes: a first estimation process of estimating a replacement time of the consumable part of the processing device; a specifying process of specifying a timing after processing of the substrate performed by the processing device is completed in a period before the replacement time as a replaceable timing of the consumable part; a second estimation process of estimating a first movement time period required for the part transporting device to move to a position of the processing device requiring replacement of the consumable part; a third estimation process of estimating a first preparation time period required for preparation until the part transporting device that has moved to the position of the processing device requiring the replacement of the consumable part becomes a state in which the consumable part is replaceable; and a transmission process of transmitting a replacement instruction to the part transporting device at a timing before a timing that is earlier than the replaceable timing by a total time of the first movement time period and the first preparation time period, and instructing the part transporting device to replace the consumable part.

BRIEF DESCRIPTION OF THE DRAWINGS

FIG. 14 is a diagram illustrating an example of a reservation table.

DETAILED DESCRIPTION

Hereinafter, exemplary embodiments of a part replacement method will be described in detail with reference to the drawings. The part replacement method described below is not limited by the following embodiments.

When the replacement time of a consumable part has been reached, if a substrate is being processed in a processing device, the replacement of the consumable part is not performed until the processing is completed. In the case where the processing is completed after the replacement time of the consumable part has passed, the consumable part will be replaced after the replacement time has passed. Meanwhile, when the consumable part is transported near the processing device in order to replace the consumable part after the processing of the processing device is completed, a long downtime of the processing device is caused since it takes time until the consumable part can be actually replaced.

Therefore, the present disclosure provides a technique capable of shortening the downtime of the processing device caused due to the replacement of the consumable part.

First Embodiment (Configuration of Processing System 10)

Figure 1:
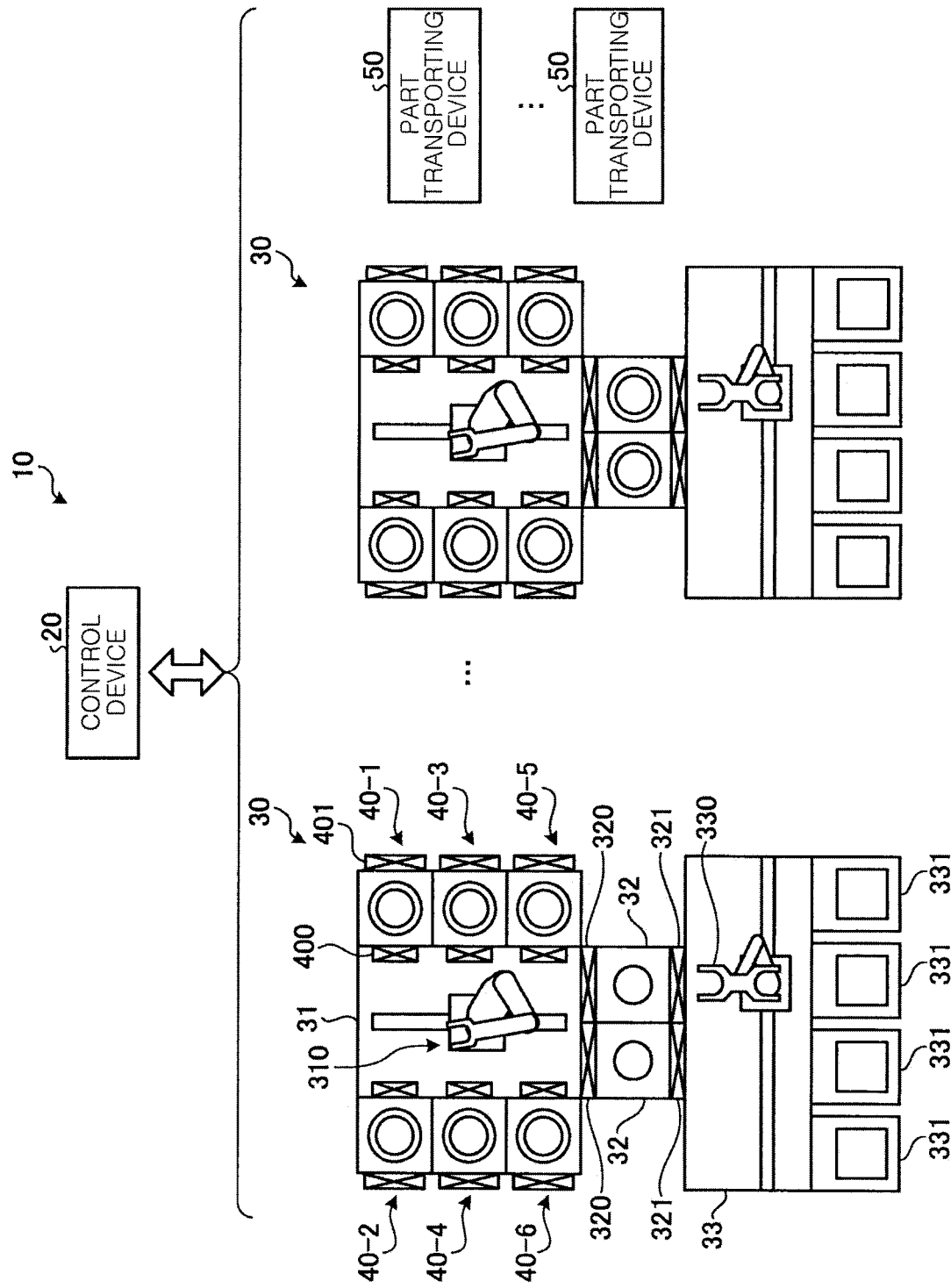
FIG. 1 is a system configuration diagram illustrating an example of a processing system according to an embodiment of the present disclosure.

FIG. 1 is a system configuration diagram illustrating an example of a processing system 10 according to an embodiment of the present disclosure. In the embodiment, the processing system 10 includes a control device 20, a plurality of processing groups 30, and a plurality of part transporting devices 50. The control device 20 communicates with each processing group 30 and each part transporting device 50 and controls each processing group 30 and each part transporting device 50.

Each processing group 30 has a vacuum transfer chamber 31, a plurality of processing devices 40-1 to 40-6, a plurality of load lock chambers 32, and an atmosphere transfer chamber 33. In the following, when each of the plurality of processing devices 40-1 to 40-6 is generically referred to without distinction, it will be described as a processing device 40.

The plurality of processing devices 40 and the plurality of load lock chambers 32 are connected to the vacuum transfer chamber 31. In the present embodiment, six processing devices 40 are connected to the vacuum transfer chamber 31, but five or less processing devices 40 may be connected to the vacuum transfer chamber 31, and seven or more processing devices 40 may be connected to the vacuum transfer chamber 31. Further, in the present embodiment, two load lock chambers 32 are connected to the vacuum transfer chamber 31, but one load lock chamber 32 may be connected to the vacuum transfer chamber 31, and three or more load lock chambers 32 may be connected thereto.

For example, each processing device 40 performs processing such as etching and film formation on a substrate in a low-pressure environment. A consumable part that is consumed according to the processing on the substrate is provided in each processing device 40. Each processing device 40 is partitioned from the vacuum transfer chamber 31 by a gate valve 400. Further, each processing device 40 includes a gate valve 401 for unloading a used consumable part and loading an unused consumable part. Each processing device 40 may be a device that executes the same process in a manufacturing process or may be a device that executes different processes.

Each load lock chamber 32 has gate valves 320 and 321 to switch an internal pressure from a predetermined vacuum pressure to the atmospheric pressure or from the atmospheric pressure to a predetermined vacuum pressure. The load lock chamber 32 is partitioned from the vacuum transfer chamber 31 by the gate valve 320. Further, the load lock chamber 32 is partitioned from the atmosphere transfer chamber 33 by the gate valve 321.

A robot arm 310 is disposed in the vacuum transfer chamber 31. The inside of the vacuum transfer chamber 31 is maintained at a predetermined vacuum level. In the present embodiment, the robot arm 310 takes a non-processed substrate out of the inside of the load lock chamber 32 decompressed to a predetermined vacuum level and transfers the substrate into any one of the processing devices 40. Further, the robot arm 310 extracts a processed substrate from the processing device 40 and transfers the substrate into another processing device 40 or the load lock chamber 32.

The atmosphere transfer chamber 33 is connected to the load lock chamber 32. A robot arm 330 is provided in the atmosphere transfer chamber 33. Further, the atmosphere transfer chamber 33 includes a plurality of load ports 331 to which a container (for example, FOUP: Front Opening Unified Pod) capable of accommodating a plurality of non-processed substrates and/or a plurality of processed substrates is connected. The robot arm 330 takes the non-processed substrate out of the container connected to the load port 331 and transfers the substrate into the load lock chamber 32. Further, the robot arm 330 takes the processed substrate out of the load lock chamber 32 and transfers the substrate into the container connected to the load port 331. Moreover, the atmosphere transfer chamber 33 may include an alignment unit for adjusting an orientation of the substrate taken out of the container connected to the load port 331.

Each part transporting device 50 has the unused consumable part and the robot arm therein and moves to a position of the processing device 40 having a consumable part that needs to be replaced according to an instruction from the control device 20. Then, the part transporting device 50 is connected to the processing device 40 having the consumable part that needs to be replaced via the gate valve 401. Then, after the inside of the part transporting device 50 is evacuated, the gate valve 401 is opened, and the used consumable part and the non-used consumable part are replaced with each other by the robot arm.

(Configuration of Processing Device 40)

Figure 2:
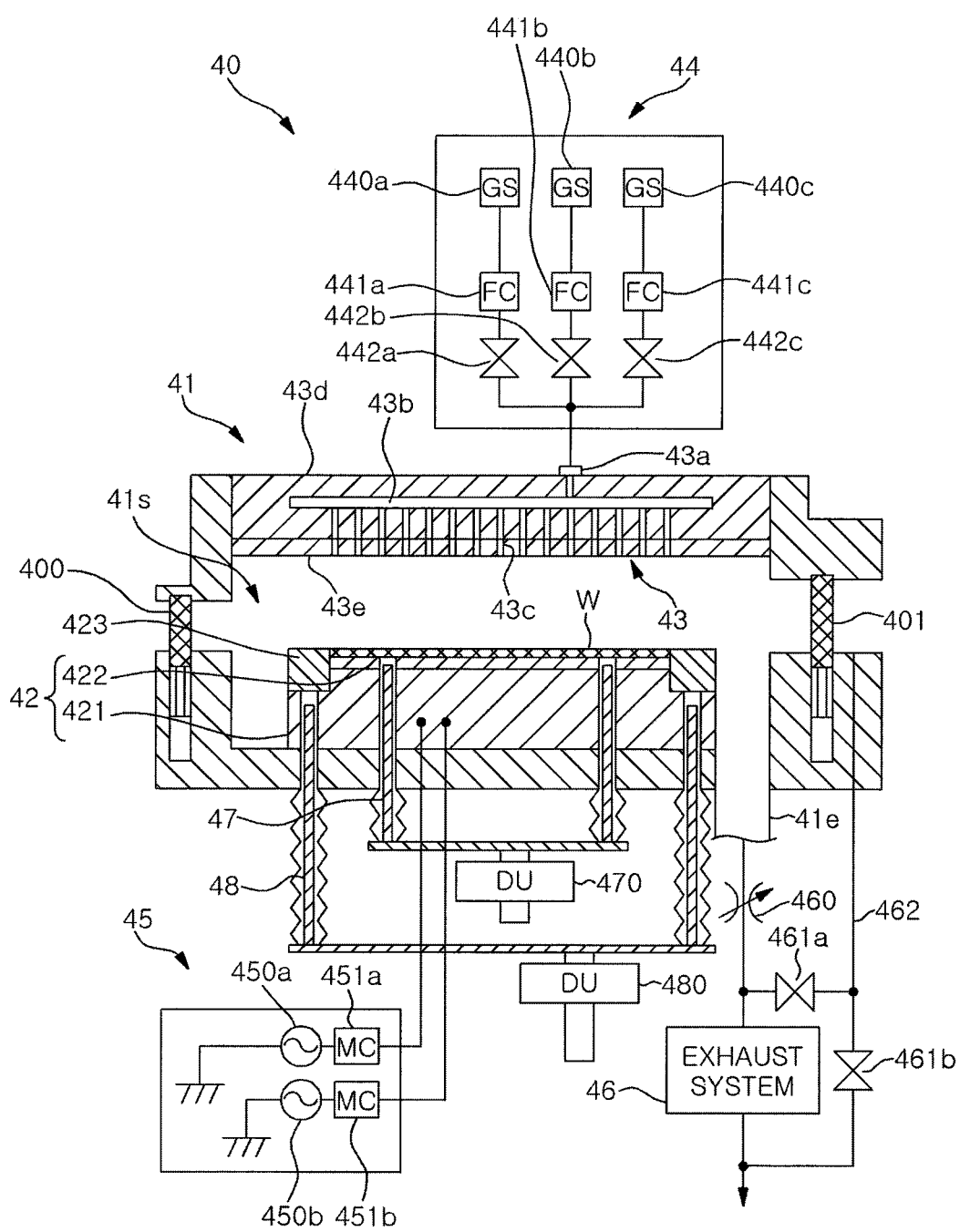
FIG. 2 is a diagram illustrating an example of a processing device according to a first embodiment.

FIG. 2 is a diagram illustrating an example of a processing device 40 according to a first embodiment. In the present embodiment, the processing device 40 includes a chamber 41, a gas supply 44, a radio frequency (RF) power supply 45, and an exhaust system 46.

The chamber 41 has a support 42 and an upper electrode shower head assembly 43. The support 42 is disposed in a lower region of a processing space 41*s* in the chamber 41. The upper electrode shower head assembly 43 is disposed above the support 42 and may function as a portion of a top plate of the chamber 41. The chamber 41 is an example of a second container.

The support 42 is configured to support a substrate W in the processing space 41*s*. In the present embodiment, the support 42 includes a lower electrode 421 and an electrostatic chuck 422. The lower electrode 421 is an example of a base member. The electrostatic chuck 422 is disposed on the lower electrode 421 and is configured to support the substrate W on an upper surface of the electrostatic chuck 422. An edge ring 423 is provided on an upper surface of a peripheral edge of the lower electrode 421. The edge ring 423 is disposed so as to surround the electrostatic chuck 422 and the substrate W on the upper surface of the peripheral edge of the lower electrode 421. The upper surface of the electrostatic chuck 422 is an example of a substrate support surface. The support 42 is an example of a substrate support. The edge ring 423 is an example of a consumable part.

Through holes through which lift pins 47 pass are formed in a bottom of the chamber 41, the lower electrode 421, and the electrostatic chuck 422. Each of the lift pins 47 is raised or lowered by a drive unit (DU) 470 when the substrate W is loaded and unloaded. Accordingly, the substrate W loaded into the chamber 41 may be received from the robot arm 310 and placed on the electrostatic chuck 422, and the processed substrate W is passed to the robot arm 310 and unloaded from the inside of the chamber 41.

Further, through holes through which lift pins 48 pass are formed in the bottom of the chamber 41 and the lower electrode 421. Each of the lift pins 48 is raised or lowered by a drive unit (DU) 480 when the edge ring 423 is replaced. Accordingly, a used edge ring 423 may be passed to the robot arm of the part transporting device 50 and unloaded from the inside of the chamber 41, and an unused edge ring 423 may be received from the robot arm of the part transporting device 50 and placed on the lower electrode 421.

Figure 3:
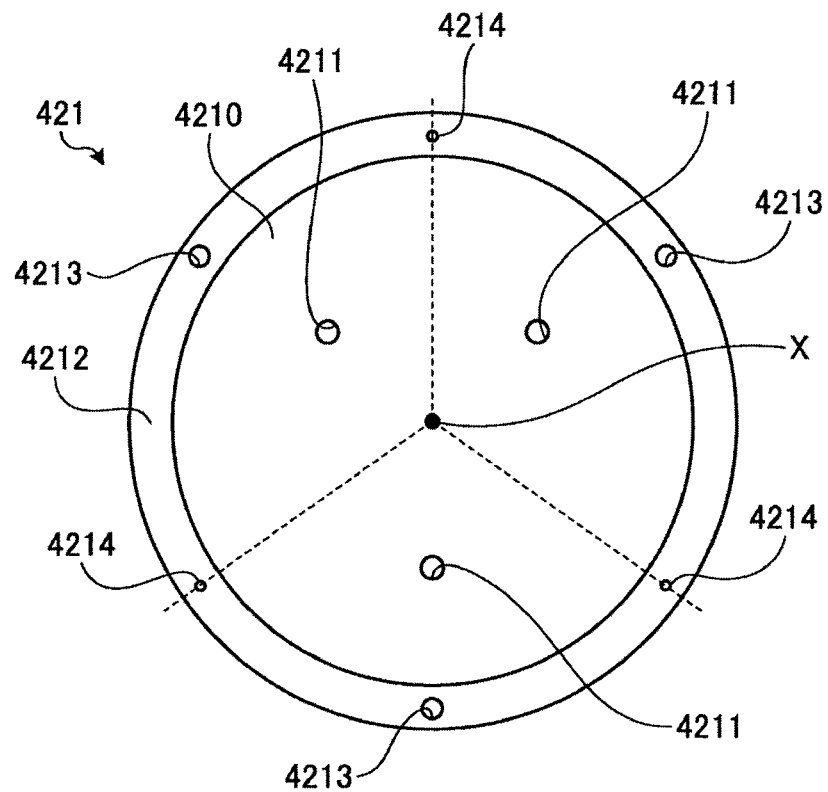
FIG. 3 is a diagram illustrating an example of an upper surface of a lower electrode.

FIG. 3 is a diagram illustrating an example of an upper surface of the lower electrode 421. A plurality of through holes 4211 through which the lift pins 47 pass are provided in a region 4210 on the upper surface (a surface where the electrostatic chuck 422 is disposed) of the lower electrode 421, and the electrostatic chuck 422 is disposed on the upper surface. In a region 4212 around the region 4210, a plurality of through holes 4213 through which the lift pins 48 pass and a plurality of protrusions 4214 used for positioning the edge ring 423 are provided and the edge ring 423 is disposed. In the present embodiment, the plurality of protrusions 4214 are disposed on a circumference centered on a central axis X of the substrate W placed on the electrostatic chuck 422.

Figure 4:
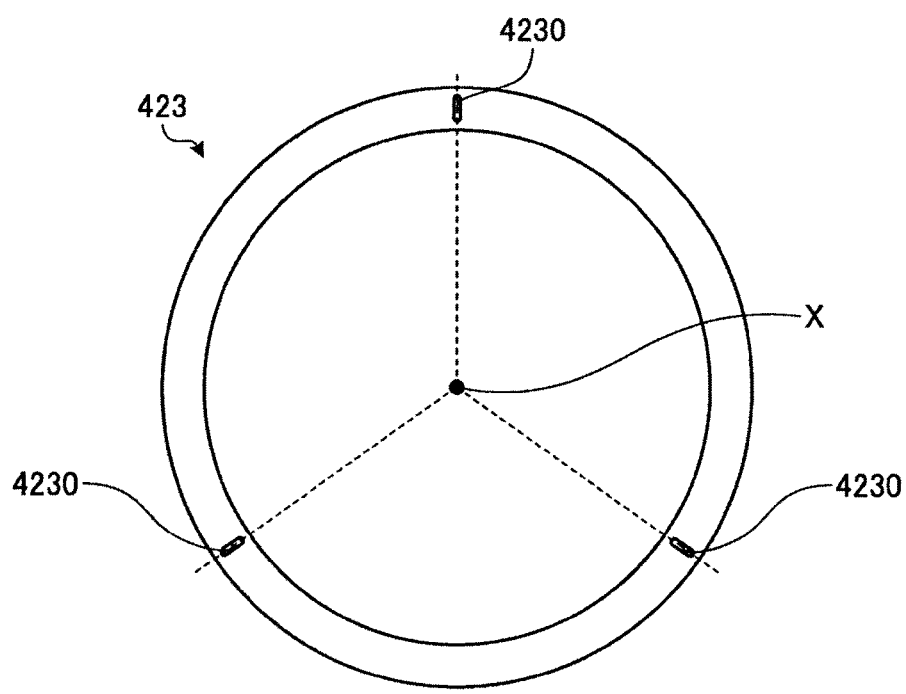
FIG. 4 is a diagram illustrating an example of a lower surface of an edge ring.

FIG. 4 is a diagram illustrating an example of a lower surface of the edge ring 423. A plurality of recesses 4230 are provided in the lower surface (a surface in contact with the lower electrode 421) of the edge ring 423. In the present embodiment, the plurality of recesses 4230 are formed in the circumference centered on the central axis X of the substrate W placed on the electrostatic chuck 422. In the present embodiment, three recesses 4230 are formed in the lower surface of the edge ring 423. As long as the plurality of recesses 4230 are formed in the lower surface of the edge ring 423, two recesses 4230 may be formed or four or more recesses 4230 may be formed.

Figure 5:
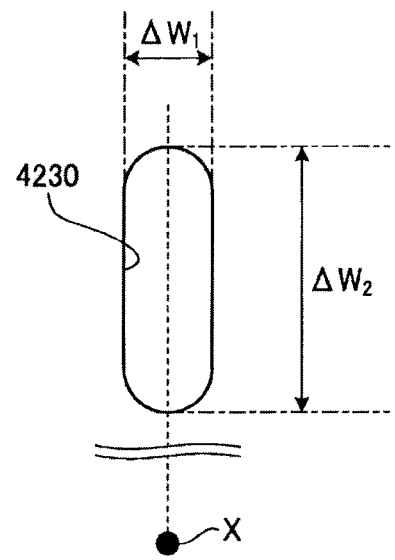
FIG. 5 is an enlarged view illustrating an example of a shape of an opening of a recess.

FIG. 5 is an enlarged view illustrating an example of a shape of an opening of the recess 4230. In the present embodiment, for example, as illustrated in FIG. 5, the shape of the opening of the recess 4230 is an elongated hole shape having a width $\Delta W_1$ in a circumferential direction of a circle centered on the central axis X and a width $\Delta W_2$ in a radial direction of the circle centered on the central axis X. The width $\Delta W_1$ is a width obtained by adding a design clearance to a width of the protrusion 4214 in the circumferential direction of the circle centered on the central axis X. The width $\Delta W_2$ is wider than the width $\Delta W_1$. In the present embodiment, the recess 4230 is formed in the edge ring 423 so that a longitudinal axis in the shape of the opening is oriented along the radial direction of the circle centered on the central axis X.

Therefore, the edge ring 423 is placed on the lower electrode 421 such that the protrusion 4214 is inserted into the recess 4230, and thus, a central axis of the edge ring 423 and the central axis X of the substrate W placed on the electrostatic chuck 422 may substantially coincide with each other. Further, even when the edge ring 423 is thermally expanded during the processing of the substrate W, a misalignment between the central axis of the edge ring 423 and the central axis X of the substrate W placed on the electrostatic chuck 422 may be suppressed.

Figure 6:
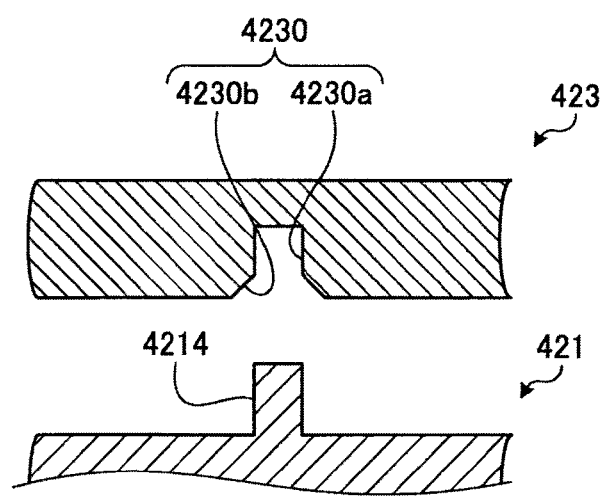
FIG. 6 is an enlarged cross-sectional view illustrating an example of shapes of the recess and a protrusion.

For example, the opening of the recess 4230 may have a sloped portion as illustrated in FIG. 6. FIG. 6 is an enlarged cross-sectional view illustrating an example of the shapes of the recess 4230 and the protrusion 4214. The recess 4230 includes a sidewall 4230*a* extending in a depth direction of the recess 4230 toward the opening of the recess 4230, and a sloped portion 4230*b* in which the width of the recess 4230 is widened from the sidewall 4230*a* toward the opening of the recess 4230. Therefore, when the edge ring 423 is placed on the lower electrode 421, the edge ring 423 may be placed on the lower electrode 421 so that the protrusion 4214 is inserted into the recess 4230 even when a position of the recess 4230 and a position of the protrusion 4214 are slightly misaligned. Accordingly, the central axis of the edge ring 423 and the central axis X of the substrate W placed on the electrostatic chuck 422 may be made to substantially coincide with each other easily.

Figure 7:
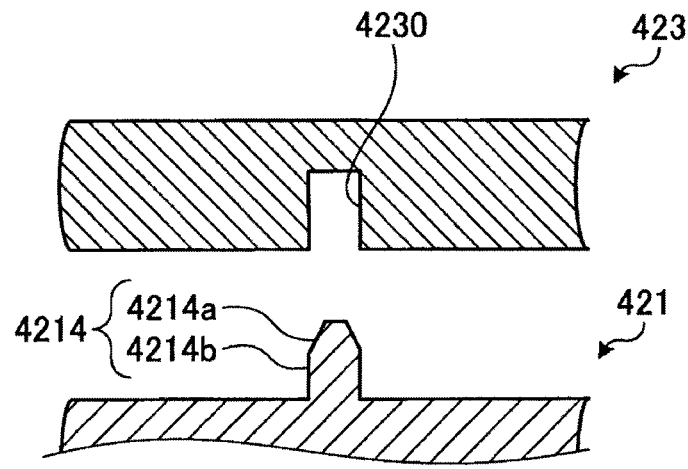
FIG. 7 is an enlarged cross-sectional view illustrating another example of the shapes of the recess and the protrusion.
Figure 8:
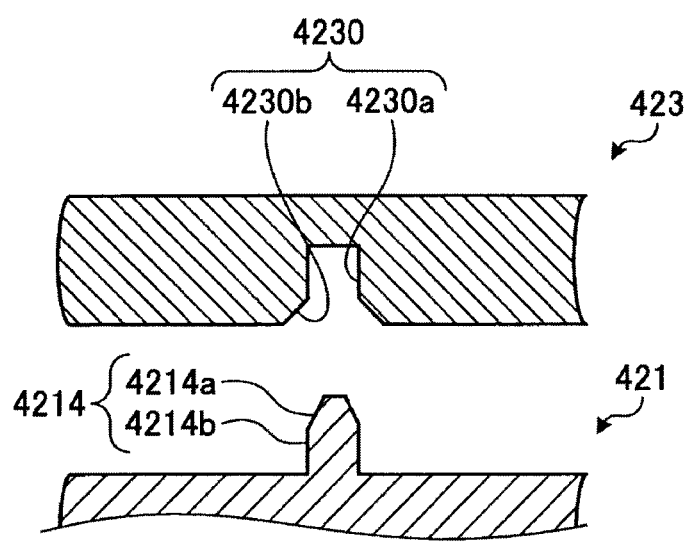
FIG. 8 is an enlarged cross-sectional view illustrating still another example of the shapes of the recess and the protrusion.

Further, for example, as illustrated in FIG. 7, the sloped portion may be formed on the protrusion 4214 side. FIG. 7 is an enlarged cross-sectional view illustrating another example of the shapes of the recess 4230 and the protrusion 4214. The protrusion 4214 of the lower electrode 421 includes a sidewall 4214*b* extending from a root of the protrusion 4214 in a protruding direction of the protrusion 4214, and a sloped portion 4214*a* in which a width of the protrusion 4214 is narrowed from the sidewall 4214*b* toward a tip end of the protrusion 4214. Alternatively, for example, as illustrated in FIG. 8, the sloped portions may be formed in both the recess 4230 and the protrusion 4214. FIG. 8 is an enlarged cross-sectional view illustrating still another example of the shapes of the recess 4230 and the protrusion 4214.

Moreover, in the present embodiment, the lower electrode 421 includes the protrusion 4214, and the edge ring 423 includes the recess 4230, but the present disclosure is not limited thereto. As long as the recess is provided in one side of the lower electrode 421 and the edge ring 423 and the protrusion is provided in the other side at opposite positions of the lower electrode 421 and the edge ring 423, the lower electrode 421 may include the recess and the edge ring 423 may include the protrusion.

Further, in the present embodiment, the shape of the opening of the recess 4230 formed in the edge ring 423 is a long hole, but the present disclosure is not limited thereto. For example, the shape of the opening of the recess 4230 formed in the edge ring 423 may be a groove extending in the radial direction of the circle centered on the central axis X. In this case, the protrusion 4214 of the lower electrode 421 is a ridge extending in the radial direction of the circle centered on the central axis X and may be a ridge having a shape corresponding to the shape of the opening of the recess 4230.

The descriptions will be continued by referring back to FIG. 2. The upper electrode shower head assembly 43 is configured to supply one or more types of gas from the gas supply 44 into the processing space 41s. In the present embodiment, the upper electrode shower head assembly 43 includes an electrode support 43d and an upper electrode 43e. The electrode support 43d has a gas inlet 43a and a gas diffusion chamber 43b and supports the upper electrode 43e on a lower surface thereof. The gas supply 44 and the gas diffusion chamber 43b fluid-communicate with each other through the gas inlet 43a. A plurality of gas outlets 43c are formed in the electrode support 43d and the upper electrode 43e, and the gas diffusion chamber 43b and the processing space 41s fluid-communicate with each other through the plurality of gas outlets 43c. In the present embodiment, the upper electrode shower head assembly 43 is configured to supply one or more types of gas from the gas inlet 43a into the processing space 41s via the gas diffusion chamber 43b and the plurality of gas outlets 43c.

The gas supply 44 has a plurality of gas sources (GS) 440a to 440c, a plurality of flow controllers (FC) 441a to 441c, and a plurality of valves 442a to 442c. For example, the gas source 440a is a supply source of a processing gas, the gas source 440b is a supply source of a cleaning gas, and the gas source 440c is a supply source of an inert gas. In the present embodiment, for example, the inert gas is a nitrogen gas. For example, the flow controllers 441a to 441c may include a mass flow controller or a pressure-controlled flow controller. Further, the gas supply 44 may include one or more gas flow modulation devices that modulate or pulse the flow rates of one or more processing gases.

The RF power supply 45 is configured to supply RF power, for example, one or more RF power, to one or more electrodes such as the lower electrode 421, the upper electrode shower head assembly 43, or both of the lower electrode 421 and the upper electrode shower head assembly 43. In the present embodiment, the RF power supply 45 includes two RF generators 450a and 450b and two matching circuits (MC) 451a and 451b. In the present embodiment, the RF power supply 45 is configured to supply first RF power from the RF generator 450a to the lower electrode 421 via the matching circuit 451a. An RF spectrum includes a portion of an electromagnetic spectrum in a range of 3 Hz to 3000 GHz. For an electronic material process such as a semiconductor process, the frequency of the RF spectrum used for plasma generation is preferably a frequency in a range of 100 kHz to 3 GHz and more preferably a frequency in a range of 200 kHz to 150 MHz. For example, the frequency of the first RF power may be a frequency in the range of 27 MHz to 100 MHz.

Further, the RF power supply 45 in the present embodiment is configured to supply second RF power from the RF generator 450b to the lower electrode 421 via the matching circuit 451b. For example, the frequency of the second RF power may be a frequency in the range of 400 kHz to 13.56 MHz. Alternatively, the RF power supply 45 may have a direct current (DC) pulse generator instead of the RF generator 450b.

Further, although not illustrated, other embodiments are considered here. For example, in the RF power supply 45 of an alternative embodiment, the RF generator may supply the first RF power to the lower electrode 421, and another RF generator may supply the second RF power to the lower electrode 421. Still another RF generator may be configured to supply third RF power to the upper electrode shower head assembly 43. In addition, in still alternative embodiments, a DC voltage may be applied to the upper electrode shower head assembly 43. Further, in various embodiments, an amplitude of one or more RF power (that is, first RF power, second RF power, and the like) may be pulsed or modulated. Amplitude modulation may include pulsing the amplitude of the RF power between ON and OFF states or between a plurality of different ON states. Further, phase matching of the RF power may be controlled, and phase matching of the amplitude modulation of a plurality of RF power may be synchronized or asynchronous.

For example, the exhaust system 46 is connected to an exhaust port 41e provided at the bottom of the chamber 41 via a pressure control valve 460. The pressure control valve 460 is an example of a second pressure controller. The exhaust system 46 may include a vacuum pump such as a pressure valve, a turbo molecular pump, a roughing vacuum pump, or a combination thereof. A pipe 462 is connected between the pressure control valve 460 and the exhaust system 46 via a valve 461a. The pipe 462 is connected to a space outside the gate valve 401. A gas exhausted by the exhaust system 46 is exhausted from an exhaust port of the exhaust system 46 to an exhaust gas processing system that processes the exhaust gas. Further, the pipe 462 is connected to an exhaust port of the exhaust system 46 via a valve 461b.

(Part Transporting Device 50)

Figure 9:
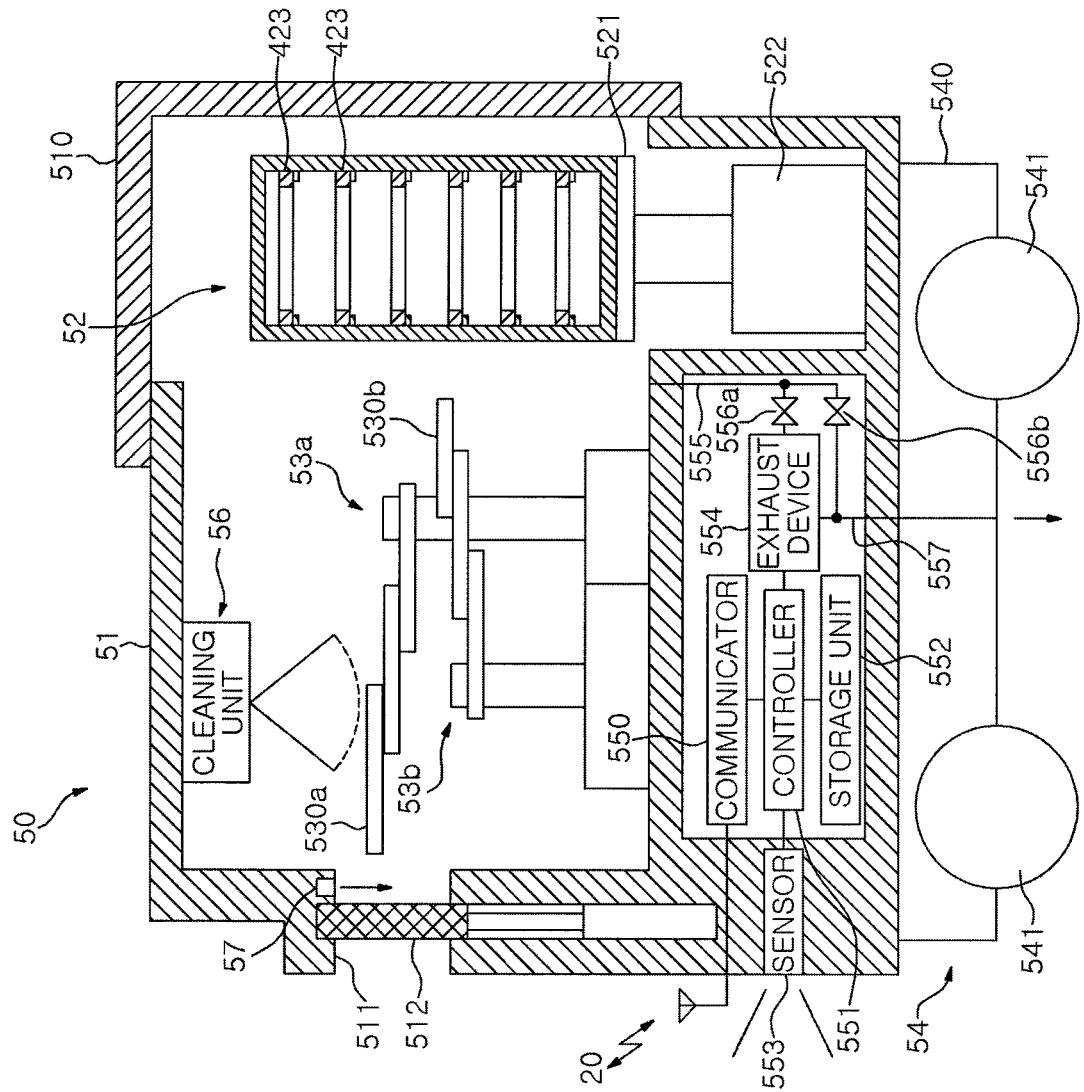
FIG. 9 is a diagram illustrating an example of a part transporting device according to the first embodiment.

FIG. 9 is a diagram illustrating an example of the part transporting device 50 according to the first embodiment. The part transporting device 50 includes a container 51, a cassette 52, a plurality of robot arms 53a and 53b, and a moving mechanism 54. The container 51 has an opening 511 connected to the processing device 40, a gate valve 512 that opens and closes the opening 511, and a lid 510. The container 51 accommodates the cassette 52 and the plurality of robot arms 53a and 53b. The gate valve 512 is an example of an on/off valve. The container 51 is an example of a first container. Moreover, in the following description, the plurality of robot arms 53a and 53b may be collectively referred to as a robot arm 53.

Figure 10:
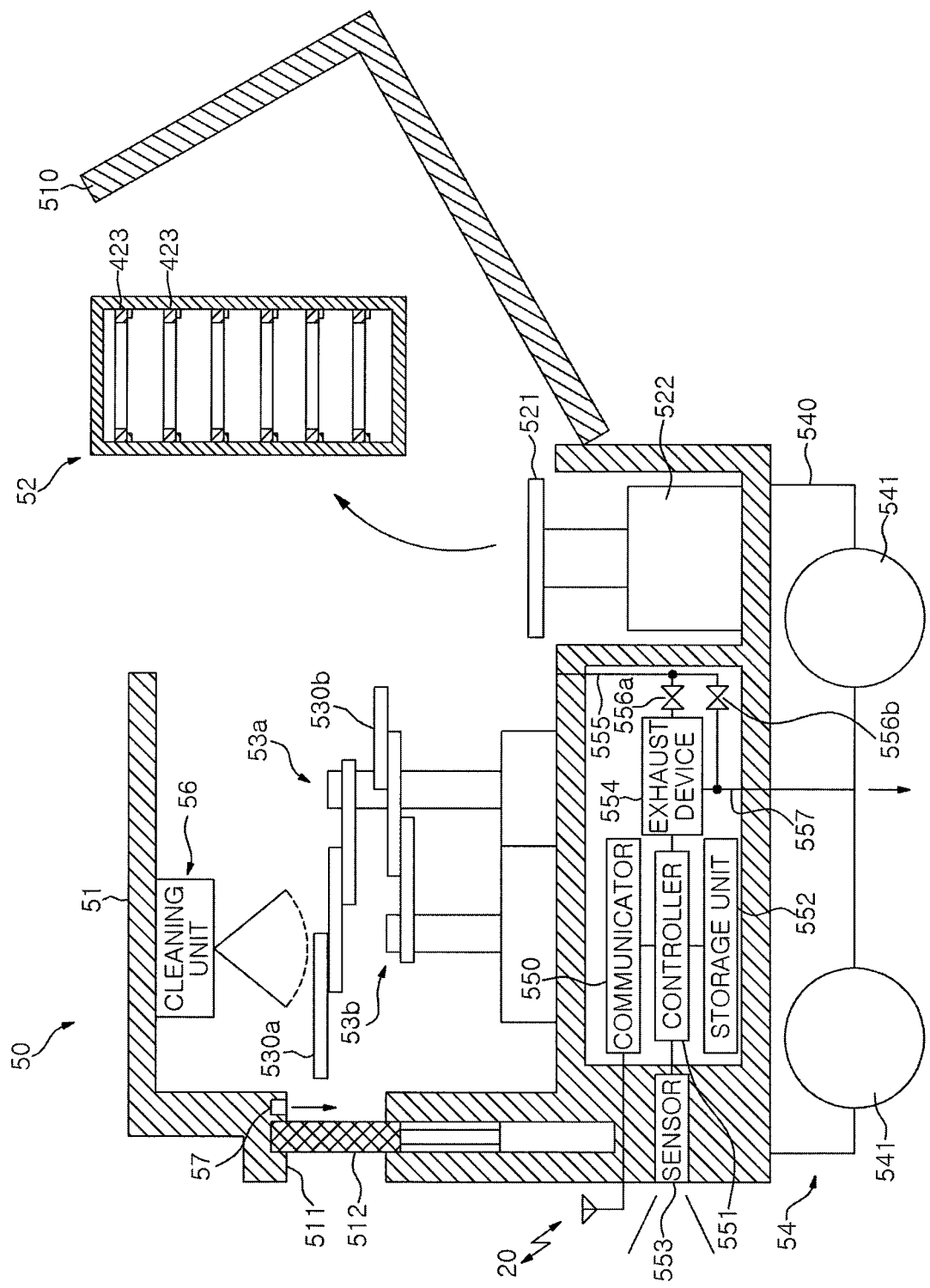
FIG. 10 is a diagram illustrating an example of the extraction of a cassette.

The cassette 52 accommodates a plurality of unused edge rings 423. The cassette 52 is an example of a part housing. Moreover, the cassette 52 also accommodates a used edge ring 423 that has been replaced with the unused edge ring 423. The cassette 52 is placed on a stage 521, and the stage 521 is raised or lowered by a drive unit 522. Accordingly, each robot arm 53 may extract the edge rings 423 accommodated and arranged vertically in the cassette 52 from the cassette 52. When all the edge rings 423 in the cassette 52 become the used edge rings 423, for example, as illustrated in FIG. 10, the lid 510 is opened, the cassette 52 is extracted from the inside of the container 51 and is replaced with a cassette 52 in which the plurality of unused edge rings 423 are accommodated. FIG. 10 is a diagram illustrating an example of the extraction of the cassette 52.

The robot arm 53a has an end effector 530a at a tip end thereof and extracts the unused edge ring 423 from the cassette 52 using the end effector 530a. Further, the robot arm 53b has an end effector 530b at a tip end thereof, and the robot arm 53b transfers the used edge ring 423 from the processing device 40 through the opening 511 such that the used edge ring 423 is accommodated in the cassette 52. Then, the robot arm 53a transfers the unused edge ring 423 into the processing device 40 through the opening 511. Moreover, in the following description, when the end effectors 530a and 530b may be collectively referred to as an end effector 530.

As described above, in the present embodiment, the end effector 530a used for transferring the unused edge ring 423 and the end effector 530b used for transferring the used edge ring 423 are separately provided. Accordingly, it is possible to prevent the unused edge ring 423 from being contaminated by reaction by-products or the like peeled off from the used edge ring 423.

In the present embodiment, the end effector 530a used for transferring the unused edge ring 423 and the end effector 530b used for transferring the used edge ring 423 are moved by separate robot arms. However, the present disclosure is not limited thereto. In the case where the end effector used for transferring the unused edge ring 423 and the end effector used for transferring the used edge ring 423 are separately provided, the two end effectors may be provided at the tip of one robot arm.

Further, in the present embodiment, the end effector 530b of the robot arm 53b supports the lower surface of the edge ring 423 when the used edge ring 423 is unloaded from the processing device 40. Accordingly, it is possible to prevent reaction by-products or the like adhered to the edge ring 423 from adhering to the end effector 530a.

Further, in the present embodiment, the robot arm 53a extracts the unused edge rings 423, which are accommodated and arranged vertically in the cassette 52, in order from the bottom. Further, in the present embodiment, the robot arm 53b transfers the used edge ring 423 to an accommodation location of the cassette 52 that is empty because of the extraction of the unused edge ring 423. Therefore, the unused edge ring 423 is accommodated above the used edge ring 423 in the cassette 52. Therefore, it is possible to prevent the reaction by-products or the like peeled off from the used edge ring 423 from falling and adhering to the unused edge ring 423.

The inside of the cassette 52 may be divided into a plurality of spaces for respectively accommodating the edge rings 423. Therefore, even when the used edge ring 423 is accommodated in any accommodation space in the cassette 52, it is possible to prevent, for example, the reaction by-products peeled off from the used edge ring 423 from falling and adhering to the unused edge ring 423.

The moving mechanism 54 has a main body 540 and wheels 541. A power supply such as a battery, a power source, and a steering mechanism are provided in the main body 540. The wheels 541 are rotated by a power source in the main body 540 to move the part transporting device 50 in a direction controlled by the steering mechanism in the main body 540. Moreover, as long as the moving mechanism 54 can move the part transporting device 50, the moving mechanism 54 may move the part transporting device 50 by a method other than the method of using the wheels 541, such as a walking type method.

Further, the part transporting device 50 includes a communicator 550, a controller 551, a storage unit 552, a sensor 553, and an exhaust device 554. The exhaust device 554 is an example of the first pressure controller. For example, the communicator 550 is a wireless communication circuit and executes wireless communication with the control device 20. The sensor 553 senses the surroundings of the part transporting device 50 and outputs a sensing result to the controller 551. In the present embodiment, for example, the sensor 553 is an image sensor that captures an image of the surroundings of the part transporting device 50 and outputs the captured image to the controller 551. The sensor 553 is an example of the first sensor.

The exhaust device 554 is connected to the space inside the container 51 via a valve 556a and a pipe 555. The exhaust device 554 exhausts a gas in the space inside the container 51 through the valve 556a and the pipe 555 and discharges the exhausted gas to the outside of the part transporting device 50 through an exhaust port 557. Accordingly, a pressure inside the container 51 may be reduced to a predetermined vacuum level, and moisture or the like adhering to the unused edge ring 423 may be reduced. Further, since the pressure inside the container 51 may be made lower than the pressure inside the processing device 40, when the part transporting device 50 is connected to the processing device 40 and the gate valve 512 is opened, a gas may flow from the inside of the processing device 40 to the inside of the container 51. Therefore, entering of particles in the container 51 into the processing device 40 is suppressed.

Further, the pipe 555 is connected to the exhaust port 557 via a valve 556b. When replacing the cassette 52, the valve 556b is opened and the space inside the container 51 is returned to the atmospheric pressure.

The storage unit 552 includes a read only memory (ROM), a hard disk drive (HDD), a solid state drive (SSD), or the like, and stores data, a program, or the like used by the controller 551. For example, the controller 551 is a processor such as a central processing unit (CPU) or a digital signal processor (DSP) and reads and executes the program in the storage unit 552 to control the entire part transporting device 50.

For example, the controller 551 controls the moving mechanism 54 using the sensing result of the sensor 553 to move the part transporting device 50 to the position of the processing device 40 instructed by the control device 20.

Further, a cleaning unit 56 for cleaning the end effector 530b of the robot arm 53b is provided in the container 51. For example, the cleaning unit 56 cleans the end effector 530b used for transferring the used edge ring 423 by purging a high-pressure gas or blasting ice. After the end effector 530b transfers the used edge ring 423, the end effector 530b is cleaned, and thus, it is possible to prevent particles adhered to the end effector 530b from the used edge ring 423 from scattering into the space inside the container 51.

Further, a positional misalignment detection sensor 57, which detects a misalignment of a position of the edge ring 423 when the unused edge ring 423 passes through the opening 511, is provided near the opening 511 of the container 51. Alternatively, the positional misalignment detection sensor 57 may be provided near the gate valve 401 of the processing device 40. The positional misalignment detection sensor 57 is an example of a second sensor. In the present embodiment, for example, the positional misalignment detection sensor 57 is a light-shielding sensor. An amount of positional misalignment of the edge ring 423 detected by the positional misalignment detection sensor 57 is output to the controller 551. The controller 551 controls the robot arm 53*a* so as to correct the misalignment detected by the positional misalignment detection sensor 57 to adjust the position of the edge ring 423. Then, the controller 551 controls the robot arm 53*a* so that the position-adjusted edge ring 423 is placed on the lift pin 48 protruding from the lower electrode 421. Accordingly, when the lift pin 48 is lowered, the protrusion 4214 of the lower electrode 421 may be inserted into the recess 4230 of the edge ring 423, and the edge ring 423 may be accurately positioned at a predetermined position in the processing device 40.

(Connection Between Processing Device 40 and Part Transporting Device 50)

Figure 11:
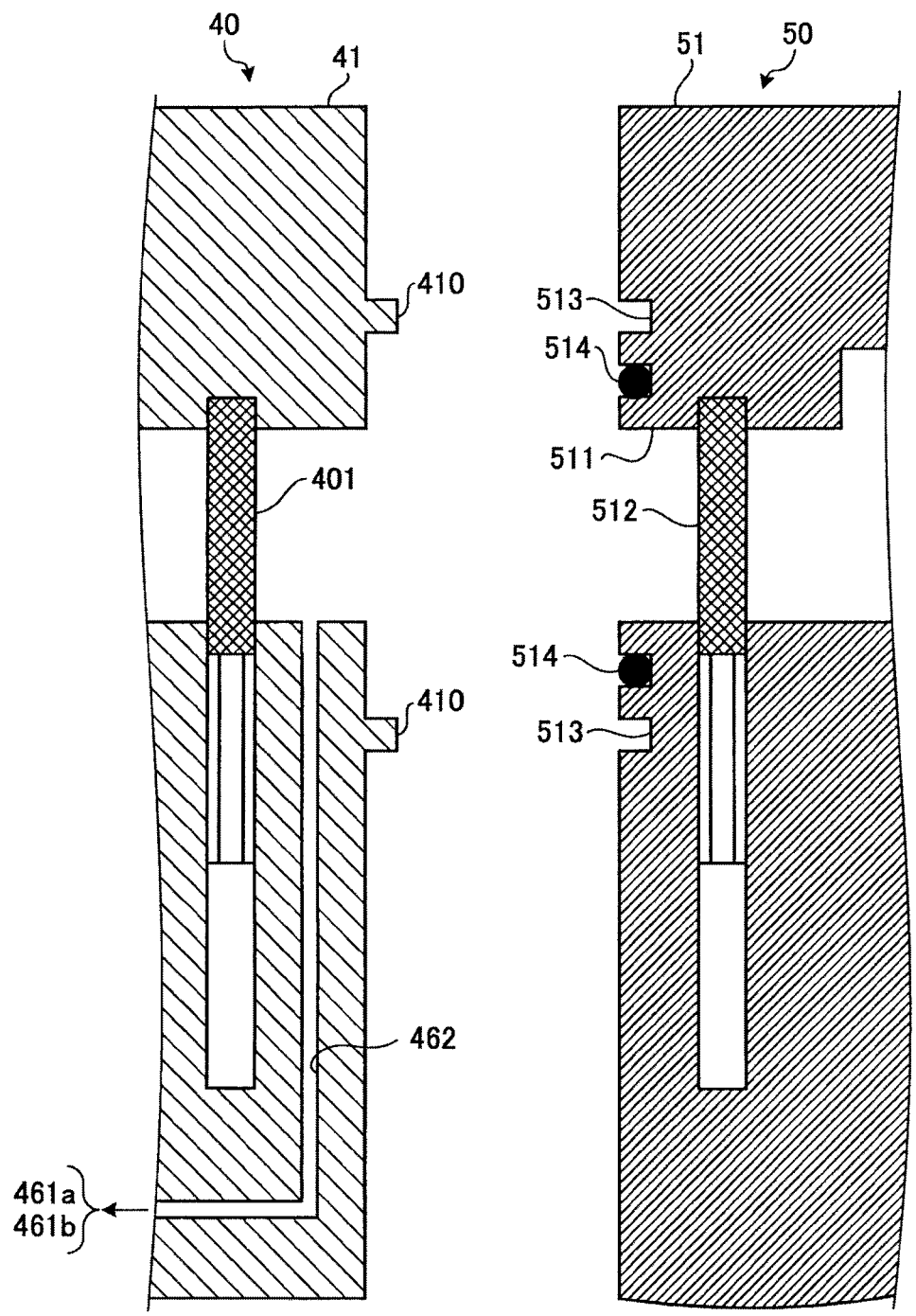
FIG. 11 is an enlarged cross-sectional view illustrating an example of a connection portion between the processing device and the part transporting device according to the first embodiment.
Figure 12:
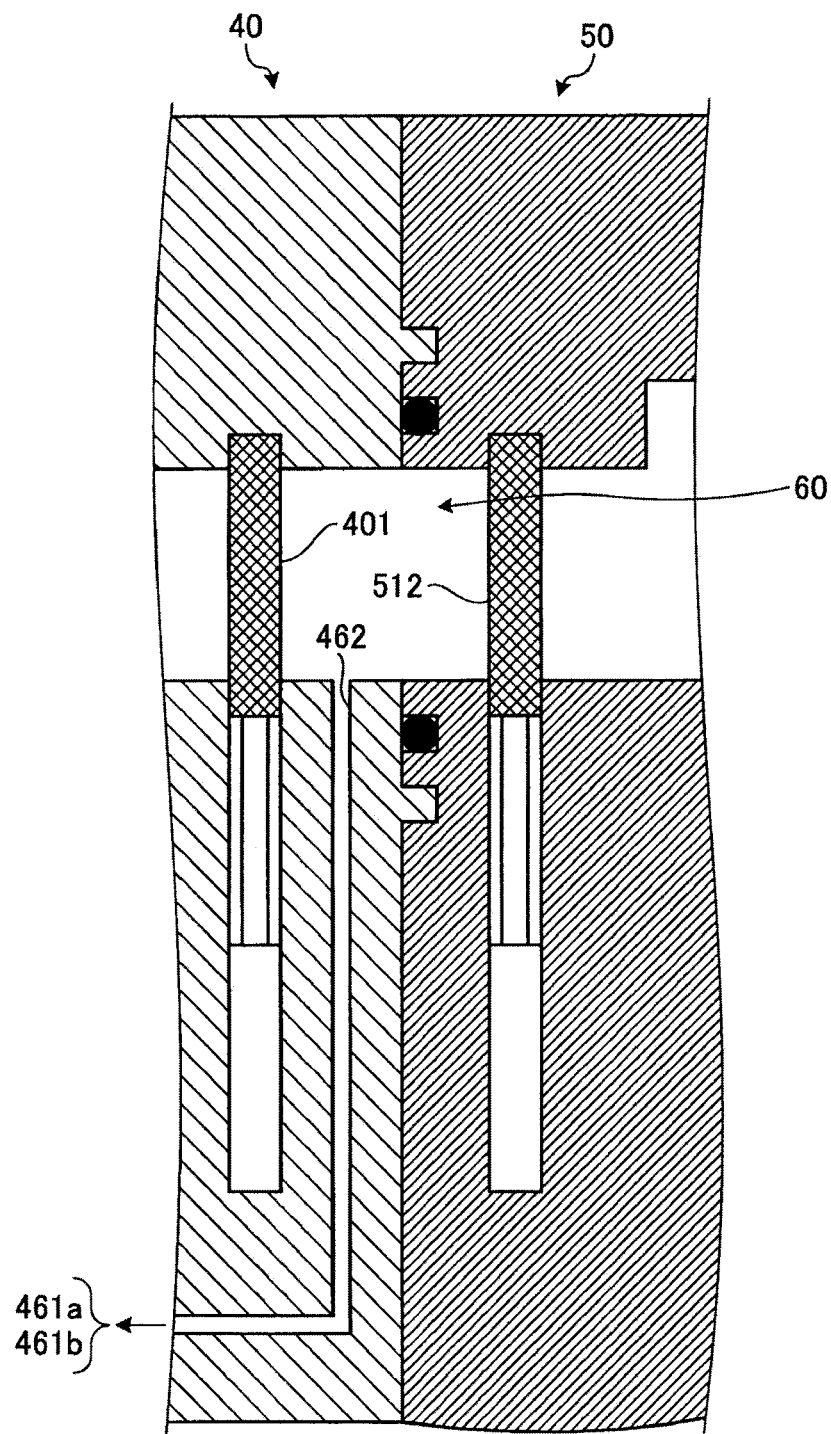
FIG. 12 is an enlarged cross-sectional view illustrating an example of the connection portion between the processing device and the part transporting device according to the first embodiment.

FIGS. 11 and 12 are enlarged cross-sectional views illustrating an example of a connection portion between the processing device 40 and the part transporting device 50 according to the first embodiment. In the present embodiment, a protrusion 410 is provided on a side surface of the chamber 41 of the processing device 40 to which the part transporting device 50 is connected. Further, a recess 513 having a shape corresponding to the protrusion 410 is provided on a side surface of the container 51 of the part transporting device 50 to which the processing device 40 is connected. When the processing device 40 and the part transporting device 50 are connected to each other, for example, as illustrated in FIG. 12, the protrusion 410 and the recess 513 are fitted to each other to support positional alignment of the processing device 40 and the part transporting device 50.

Further, a seal member 514 such as an O-ring is disposed on the side surface of the container 51 of the part transporting device 50 so as to surround the opening 511. Therefore, airtightness of a space 60 surrounded by the chamber 41, the gate valve 401, the container 51, and the gate valve 512 may be improved. After the processing device 40 and the part transporting device 50 are connected to each other, a gas in the space 60 is exhausted through the pipe 462, and thus, the pressure in the space 60 may be reduced to a predetermined vacuum level. By reducing the pressure in the space 60, the connection between the processing device 40 and the part transporting device 50 becomes stronger. Moreover, when the connection between the processing device 40 and the part transporting device 50 is released, the valve 461*b* of the processing device 40 is opened, so that the pressure in the space 60 is returned to the atmospheric pressure.

Moreover, preferably, the protrusion 410 and the recess 513 include sloped portions similar to the protrusion 4214 of the lower electrode 421 and the recess 4230 of the edge ring 423.

(Configuration of Control Device 20)

Figure 13:
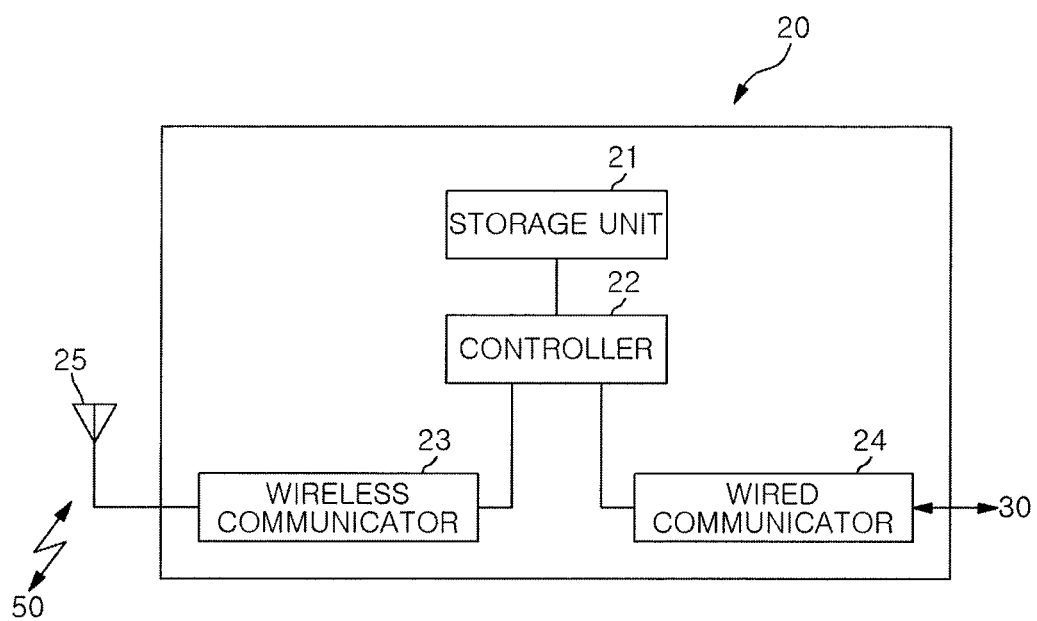
FIG. 13 is a block diagram illustrating an example of a control device.

FIG. 13 is a block diagram illustrating an example of the control device 20. The control device 20 includes a storage unit 21, a controller 22, a wireless communicator 23, and a wired communicator 24. For example, the wireless communicator 23 is a wireless communication circuit and performs wireless communication with each part transporting device 50 via an antenna 25. For example, the wired communicator 24 is a Network Interface Card (NIC) or the like, and communicates with each processing group 30. The control device 20 may execute wireless communication with each processing group 30.

The storage unit 21 includes a ROM, HDD, SSD, or the like and stores data, a program, or the like used by the controller 22. For example, a reservation table 210 to be illustrated in FIG. 14 is stored in the storage unit 21.

FIG. 14 is a diagram illustrating an example of the reservation table 210. The reservation table 210 stores a part ID, a processing device ID, replacement date and time, an RF integration time, a next replacement time, and a part transporting device ID. The part ID is information that identifies each edge ring 423. The processing device ID is information that identifies the processing device 40 to which the edge ring 423 identified by the corresponding part ID is attached. The replacement date and time are date and time when the edge ring 423 is replaced. The RF integration time is information indicating an integration time of the processing executed in the processing device 40 using the RF power. The next replacement time is date and time at which the next edge ring 423 is to be replaced. The part transporting device ID is information that identifies the part transporting device 50 that is reserved for replacement of the edge ring 423 identified by the corresponding part ID.

For example, the controller 22 is a processor such as a CPU or a DSP and reads and executes the program in the storage unit 21 to control the entire control device 20.

(Replacement Timing of Consumable Part)

Figure 15:
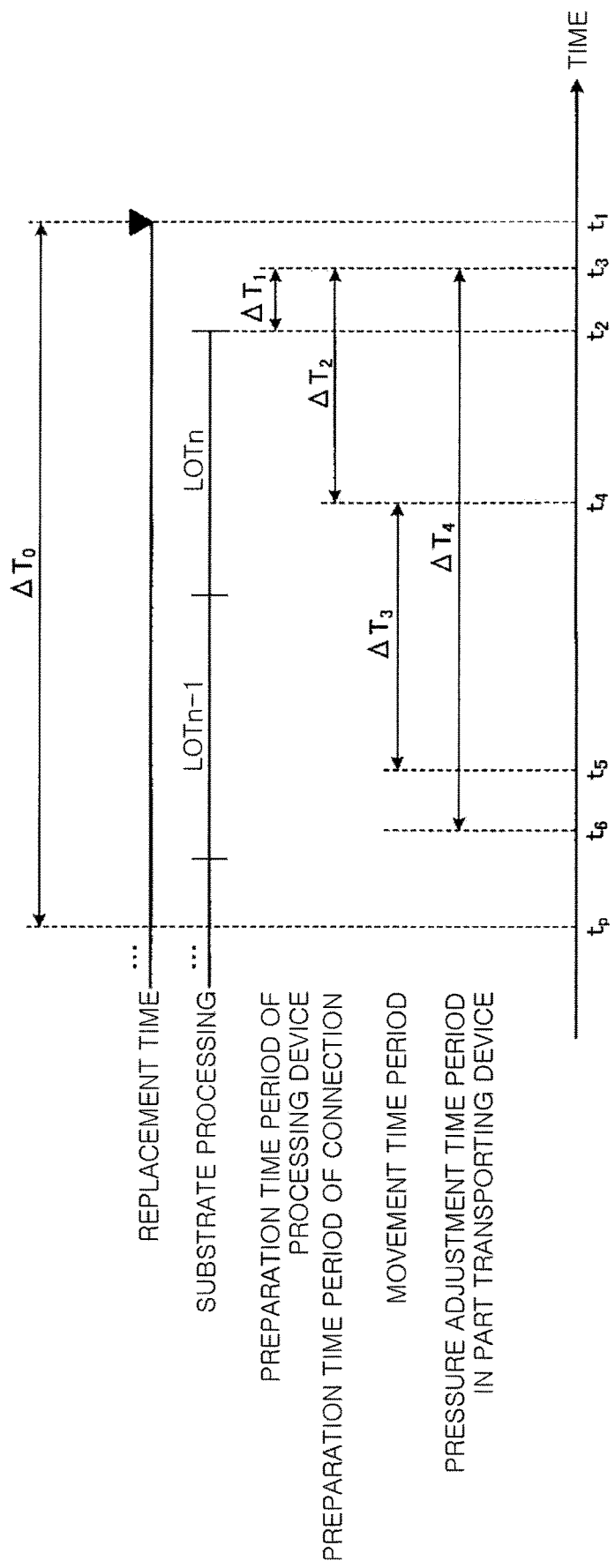
FIG. 15 is a diagram for describing an example of a replacement timing of the edge ring.

FIG. 15 is a diagram for describing an example of a replacement timing of the edge ring 423. The controller 22 of the control device 20 estimates a replacement time $t_1$ of each edge ring 423 and registers the estimated replacement time $t_1$ in a "next replacement time" column in the reservation table 210. After the edge ring 423 has been replaced, if the substrate W has not yet been processed, the control device 20 registers a standard replacement time $t_1$ estimated from the "replacement date and time" of the edge ring 423 in a "next replacement time" column.

Meanwhile, when the substrate W is processed after the edge ring 423 is replaced, the control device 20 registers the replacement time $t_1$ estimated from the "replacement date and time" and the "RF integration time" of the edge ring 423 in a "next replacement time" column. For example, the controller 22 estimates date and time when the "RF integration time" reaches a predetermined value from a tendency of a change of the "RF integration time" from the "replacement date and time," and registers the estimated date and time in a "next replacement time" column. For example, the controller 22 updates the "next replacement time" every time the "RF integration time" is updated. A process of estimating the replacement time of the edge ring 423 is an example of the first estimation process.

In the present embodiment, the controller 22 estimates the replacement time $t_1$ of the edge ring 423 based on the "RF integration time", but the present disclosure is not limited thereto. For example, the controller 22 may estimate the replacement time $t_1$ of the edge ring 423 based on at least one of the "RF integration time", "RF integration power", a "recipe integration time", a "change in weight of a consumable part", and a "change in dimensions of a consumable part". The "RF integration power" is a multiplication value of a processing time executed in the processing device 40 using the RF power and a value of the power, and the "recipe integration time" is an integration time of a specific processing recipe in which the consumable part is consumed in a particularly large amount.

Further, the controller 22 specifies a timing $t_2$ at which the processing of the substrate W in the processing device 40 finally ends in a period before the "next replacement time" for each edge ring 423. In the present embodiment, the controller 22 determines the end of the processing for each lot of the substrates W. Accordingly, it is possible to avoid a significant change in a processing environment within the lot. As another example, the controller 22 may determine the end of processing for each substrate W.

After the processing is completed at the timing $t_2$, the processing device 40 performs preparation for replacing the edge ring 423 at a preparation time period $\Delta T_1$. The preparation time period $\Delta T_1$ is a time period required for replacing the gas in the processing device 40, adjusting the pressure in the processing device 40, stabilizing the temperature of the edge ring 423, or the like. The controller 22 specifies a timing $t_3$ at which the preparation time period $\Delta T_1$ has elapsed from the timing $t_2$ as a replaceable timing of the edge ring 423. A process of specifying the replaceable timing $t_3$ is an example of a specifying process.

In order to execute the replacement of the edge ring 423 at the replaceable timing $t_3$, it is necessary to perform preparation for replacing the edge ring 423 after the part transporting device 50 is connected to the processing device 40. A preparation time period $\Delta T_2$ is a time period required for the pressure in the space 60 (see FIG. 12) between the gate valve 401 and the gate valve 512 to be reduced to a predetermined pressure. The controller 22 estimates the preparation time period $\Delta T_2$. The preparation time period $\Delta T_2$ is an example of a first preparation time period. A process of estimating the preparation time period $\Delta T_2$ is an example of a third estimation process.

In order to complete the preparation to replace the edge ring 423 at the replaceable timing $t_3$, the movement of the part transporting device 50 to the position of the processing device 40 needs to be completed at a timing $t_4$ that is earlier than the replaceable timing $t_3$ by the preparation time period $\Delta T_2$. A movement time period $\Delta T_3$ is a time period required for the part transporting device 50 to move to the position of the processing device 40 requiring the replacement of the edge ring 423. The controller 22 estimates the movement time period $\Delta T_3$. The movement time period $\Delta T_3$ is an example of a first movement time period. A process of estimating the movement time period $\Delta T_3$ is an example of a second estimation process. The part transporting device 50 may start to move before a timing $t_5$ that is earlier than the timing $t_4$ by the movement time period $\Delta T_3$. The controller 22 may manage the position of each processing device 40 and the position of each part transporting device 50 and estimate a time period required for each part transporting device 50 to move to the position of each processing device 40.

The controller 22 transmits a replacement instruction to the part transporting device 50 at a timing $t_p$ before the timing $t_5$ that is earlier than the replaceable timing $t_3$ by a total time period of the preparation time period $\Delta T_2$ and the movement time period $\Delta T_3$, and thereby instructs the part transporting device 50 to replace the edge ring 423. A process of transmitting the replacement instruction is an example of a transmission process.

Further, in order to execute the replacement of the edge ring 423 at the replaceable timing $t_3$, the pressure in the part transporting device 50 needs to be reduced to a predetermined pressure. A pressure adjustment time period $\Delta T_4$ is a time period required for the pressure in the container 51 to be reduced to a predetermined pressure. Therefore, the part transporting device 50 needs to start adjusting the pressure in the part transporting device 50 before a timing $t_6$ that is earlier than the replaceable timing $t_3$ by the pressure adjustment time period $\Delta T_4$.

Here, immediately after the cassette 52 is replaced or when the edge ring 423 is not replaced for a while, the pressure in the part transporting device 50 is higher than a predetermined pressure. Thus, the pressure adjustment time period $\Delta T_4$ becomes longer. Meanwhile, immediately after the edge ring 423 is replaced, the pressure inside the part transporting device 50 is close to a predetermined pressure. Thus, the pressure adjustment time period $\Delta T_4$ is shortened. Therefore, knowing which one of the timings $t_5$ and $t_6$ is earlier than the other depends on the state of the part transporting device 50.

From the above, it is necessary to instruct the part transporting device 50 to replace the edge ring 423 of the processing device 40 before the earlier timing between the timings $t_5$ and $t_6$ prior to the replacement time of the edge ring 423. Therefore, the controller 22 instructs the part transporting device 50 to replace the edge ring 423 of the processing device 40 at the timing $t_p$, which is earlier than the replacement time of the edge ring 423 by the time period $\Delta T°$ while also earlier than the timings $t_5$ and $t_6$. Therefore, a downtime of the processing device 40 may be shortened in the replacement of the edge ring 423, and a decrease in production efficiency caused by the replacement of the edge ring 423 may be suppressed.

(Processing of Control Device 20)

Figure 16A:
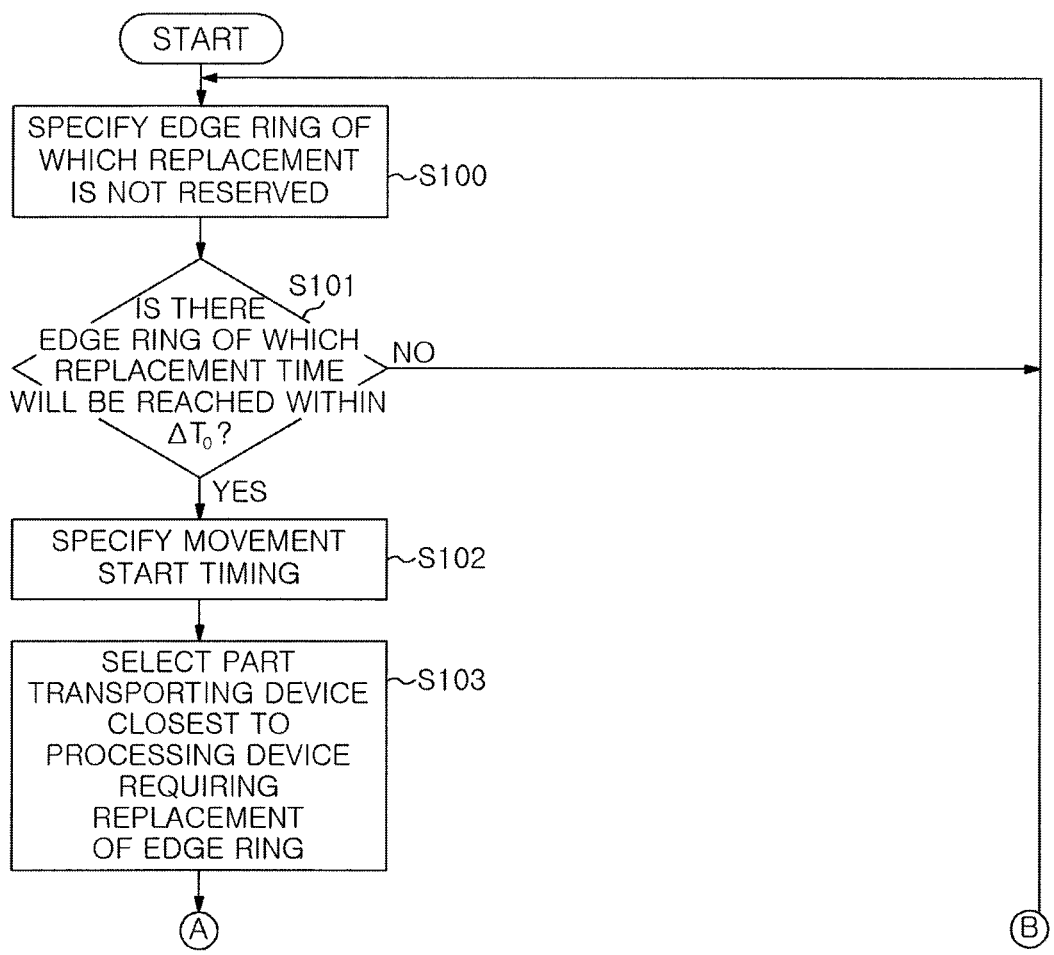
FIGS. 16A and 16B are a flowchart illustrating an example of processing of a control device when moving the part transporting device to a position of the processing device in which a consumable part needs to be replaced.
Figure 16B:
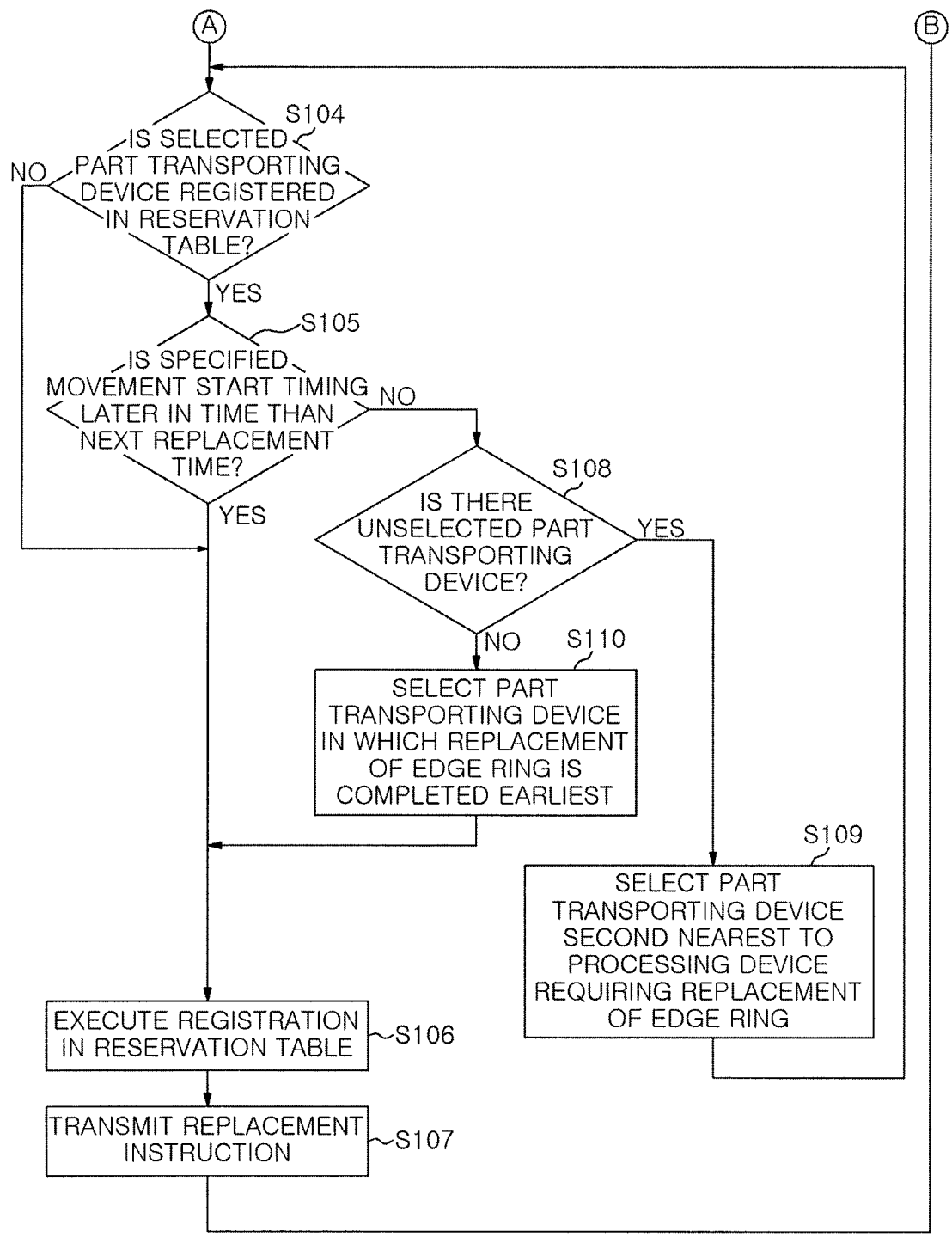

FIGS. 16A and 16B are a flowchart illustrating an example of processing of the control device 20 when moving the part transporting device 50 to a position of the processing device 40 in which the consumable part needs to be replaced. The processing illustrated in FIGS. 16A and 16B is realized by the controller 22 of the control device 20 executing a program read from the storage unit 21. The control device 20 controls the plurality of processing devices 40 and part transporting devices 50.

First, the controller 22 specifies the edge ring(s) 423 of which the replacement is not reserved with reference to the reservation table 210 (S100). For example, the controller 22 specifies the edge ring 423 having the part ID with which the part transporting device ID is not associated as the edge ring 423 of which the replacement is not reserved. Then, the controller 22 determines whether or not there is an edge ring 423 of which a replacement time will be reached within a predetermined time period $\Delta T_0$ from a current time among the specified edge rings 423 (S101). If there is no edge ring 423 of which a replacement time will be reached within the time period $\Delta T_0$ from the current time (S101: No), the controller 22 executes the processing in step S100 again.

Meanwhile, if there is an edge ring 423 of which a replacement time will be reached within the time period $\Delta T_0$ from the current time (S101: Yes), the controller 22 specifies a movement start timing (S102). The movement start timing is the earlier timing between the timings $t_5$ and $t_6$.

Next, the controller 22 selects one part transporting device 50 located closest to the position of the processing device 40 requiring the replacement of the edge ring 423 (S103). In step S103, not only a linear distance between the processing device 40 and the part transporting device 50 but also a length of a movement route when the part transporting device 50 moves to the position of the processing device 40 is taken into consideration. Then, the controller 22 determines whether or not the part transportation device ID of the part transporting device 50 selected in step S103 is registered in the reservation table 210 with reference to the reservation table 210 in the storage unit 21 (S104).

If the part transporting device ID is not registered in the reservation table 210 (S104: No), the controller 22 executes the following processing. That is, the controller 22 registers the part transporting device ID of the selected part transporting device 50 in the reservation table 210 in association with the part ID of the edge ring 423 of which it is determined that the replacement time will be reached within the time period $\Delta T_0$ in step S101 (S106). Accordingly, the selected part transporting device 50 is reserved for the replacement of the edge ring 423 of which it is determined in step S101 that the replacement time will be reached within the time period $\Delta T_0$.

Next, the controller 22 transmits a replacement instruction instructing the replacement of the edge ring 423 to the selected part transporting device 50 (S107). The replacement instruction includes position information of the processing device 40 requiring the replacement of the edge ring 423 and information on the part ID of the edge ring 423. Then, the controller 22 executes the processing illustrated in step S100 again.

Meanwhile, if the part transporting device ID is already registered in the reservation table 210 (S104: Yes), that is, if the part transporting device 50 selected in step S103 is already reserved, the controller 22 executes the following processing. That is, the controller 22 extracts the "next replacement time" that is associated with the part transporting device ID registered in the reservation table 210 in step S104, from the reservation table 210. If the part transporting device ID is associated with a plurality of "next replacement times", the controller 22 extracts, among the plurality of "next replacement times," a "next replacement time" that is the latest in time.

Then, the controller 22 determines whether or not the movement start timing specified in step S102 is later in time than the extracted "next replacement time" (S105). If the movement start timing is later in time than the "next replacement time" (S105: Yes), the part transporting device 50 may execute the current replacement of the edge ring 423 after the replacement of the already reserved edge ring 423 is completed. Therefore, the controller 22 executes the processing illustrated in step S106.

Meanwhile, if the movement start timing is earlier than the "next replacement time" (S105: No), the selected part transporting device 50 may not start the movement to the processing device 40 having the edge ring 423 that needs to be replaced until the replacement of other edge rings 423 is completed. Therefore, the controller 22 instructs the part transporting device 50, which is second nearest to the position of the processing device 40 requiring the replacement of the edge ring 423 among other part transporting devices 50, to replace the edge ring 423.

For example, the controller 22 determines whether or not there is another unselected part transporting device 50 (S108). If there is another unselected part transporting device 50 (S108: Yes), the controller 22 selects the part transporting device 50 second nearest to the position of the processing device 40 requiring the replacement of the edge ring 423 (S109). Then, the controller 22 executes the processing illustrated in step S104 again.

Meanwhile, if all the part transporting devices 50 are selected (S108: No), the controller 22 selects a part transporting device 50 in which the replacement of the edge ring 423 is completed earliest with reference to the reservation table 210 (S110). Then, the controller 22 executes the processing illustrated in step S106.

Figure 17A:
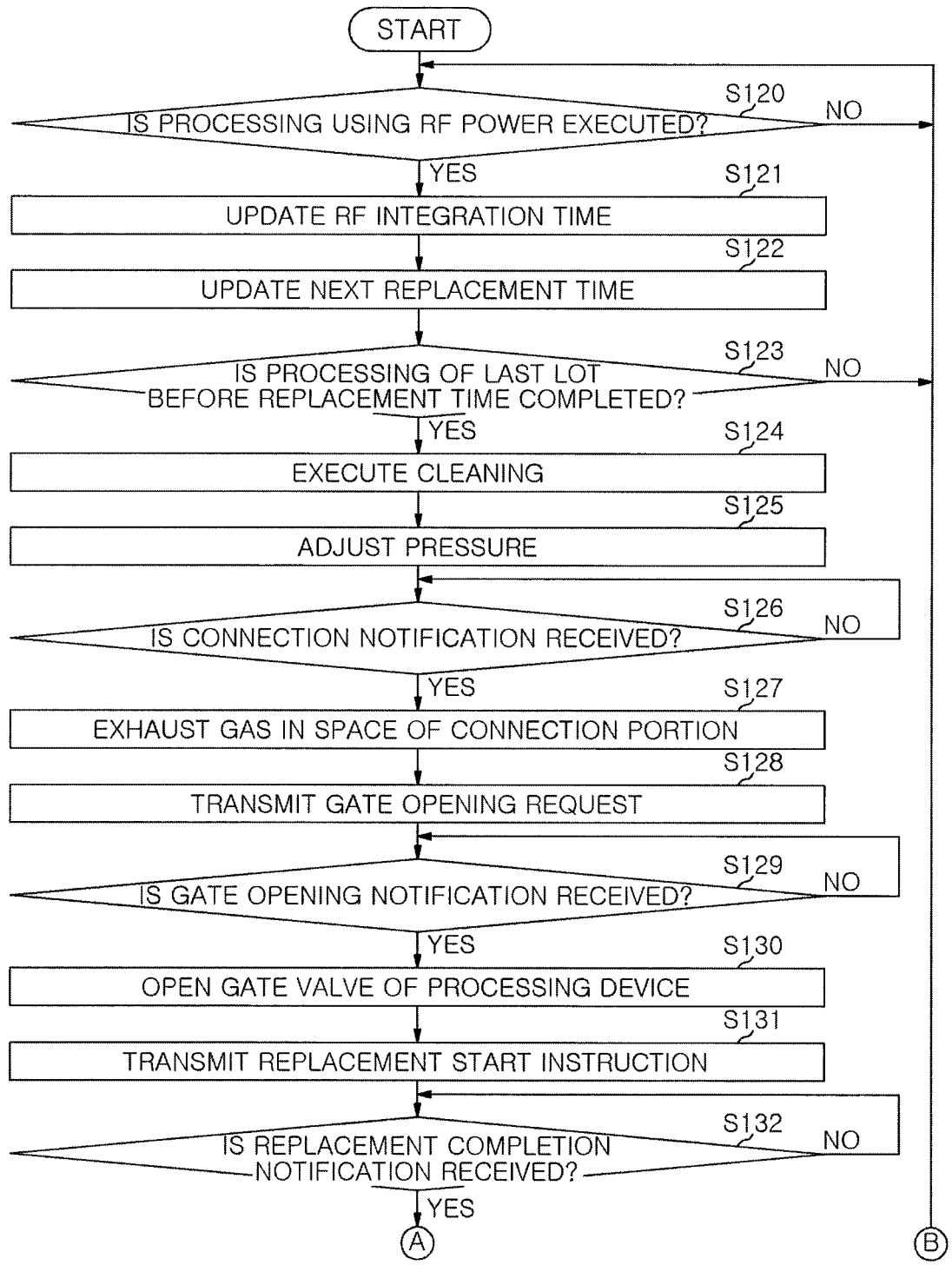
FIGS. 17A and 17B are a flowchart illustrating an example of processing of the control device when controlling the processing device in which the consumable part needs to be replaced and the part transporting device connected to the processing device.
Figure 17B:
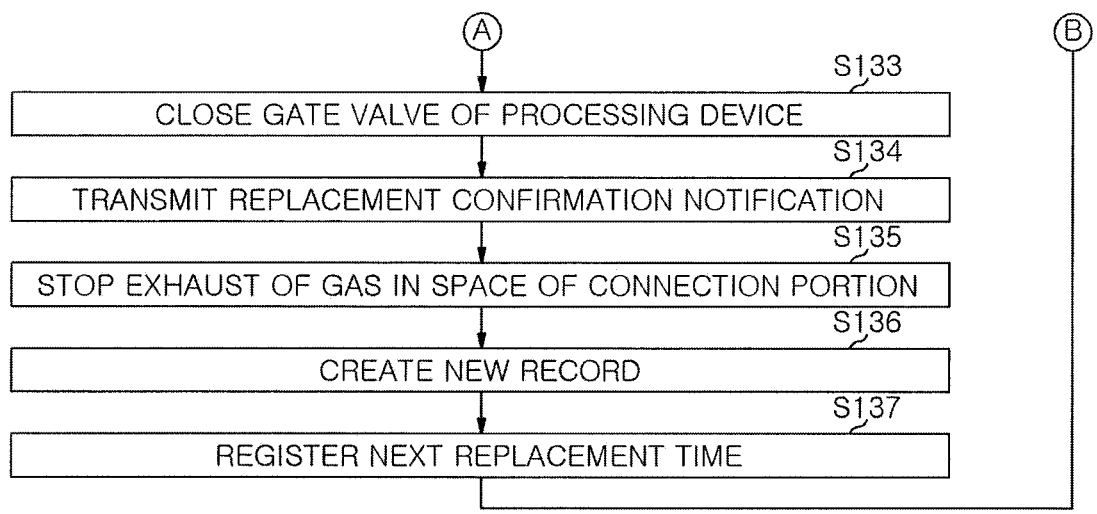

FIGS. 17A and 17B are a flowchart illustrating an example of processing of the control device 20 when controlling the processing device 40 in which the consumable part needs to be replaced and the part transporting device 50 connected to the processing device 40. FIGS. 17A and 17B illustrate the processing of the control device 20 when controlling one processing device 40 in which the consumable part needs to be replaced and one part transporting device connected to the processing device 40. Moreover, the processing of the control device 20 when controlling another processing device 40 in which the consumable part needs to be replaced and another part transporting device 50 connected to the processing device 40 is also executed in the same manner as that in the flowchart illustrated in FIGS. 17A and 17B. The processing illustrated in FIGS. 17A and 17B is realized by the controller 22 of the control device 20 executing the program read from the storage unit 21. The control device 20 controls the plurality of processing devices 40 and part transporting devices 50.

First, the controller 22 determines whether or not the processing using the RF power is executed in the processing device 40 (S120). If the processing using the RF power is not executed (S120: No), the controller 22 executes the processing illustrated in step S120 again.

If the processing using the RF power is executed (S120: Yes), the controller 22 updates the "RF integration time" associated with the processing device ID of the processing device 40 in which the processing using the RF power is executed in the reservation table 210 (S121). Then, the controller 22 estimates the "next replacement time" for the edge ring 423 of which an "RF integration time" is updated and updates the "next replacement time" associated with the "part ID" of the edge ring 423 to the estimated "next replacement time" (S122). Accordingly, the "next replacement time" corresponding to the edge ring 423 is updated according to an actual processing time using the RF power.

Next, the controller 22 determines whether or not processing of the last lot is completed before the replacement time of the consumable part based on the updated "next replacement time" (S123). If the processing of the last lot is not completed in the processing device 40 before the replacement time of the consumable part (S123: No), the controller 22 executes the processing illustrated in step S120 again.

Meanwhile, if the processing of the last lot is completed in the processing device 40 before the replacement time of the consumable part (S123: Yes), the controller 22 causes the processing device 40 in which the processing of the lot is completed to execute the cleaning of the chamber 41 (S124). Accordingly, the reaction by-products or the like adhered to the used edge ring 423 may be removed, and scattering of the reaction by-products or the like when the edge ring 423 is unloaded may be suppressed.

Moreover, the cleaning in step S124 may be executed after the edge ring 423 is lifted by the lift pin 48 and thus, from the lower electrode 421 on which the edge ring 423 is placed, the edge ring 423 is moved away from the lower electrode 421. Accordingly, it is possible to remove reaction by-products adhered to not only the upper surface of the edge ring 423 but also the side surface of the edge ring 423 and/or the upper surface of the lower electrode 421 on which the edge ring 423 was placed.

Next, the pressure in the chamber 41 of the processing device 40 in which the processing of the lot is completed is adjusted (S125). In step S125, the gas in the chamber 41 is exhausted, and the inert gas is supplied into the chamber 41. Then, the pressure in the chamber 41 is controlled to a predetermined pressure $P_1$.

Next, the controller 22 determines whether or not a connection notification is received from the part transporting device 50 (S126). Moreover, one part transporting device 50 is moved to the position of the processing device 40 in which the consumable part needs to be replaced by the processing illustrated in FIGS. 16A and 16B. If the connection notification is not received from the part transporting device 50 (S126: No), the controller 22 executes the processing illustrated in step S126 again.

Meanwhile, if the connection notification is received from the part transporting device 50 (S126: Yes), the controller 22 controls the exhaust system 46 and the valve 461*a* of the processing device 40 to exhaust the gas in the space 60 of the connection portion between the processing device 40 and the part transporting device 50 (S127). Accordingly, the pressure in the space 60 of the connection portion between the processing device 40 and the part transporting device 50 is reduced to a predetermined pressure $P_2$. In the present embodiment, the pressure $P_2$ is lower than the pressure $P_1$. Then, the controller 22 transmits a gate opening request requesting that the gate valve 512 of the part transporting device 50 be opened to the part transporting device 50 that is a transmission source of the connection notification (S128).

Next, the controller 22 determines whether or not a gate opening notification indicating that the opening of the gate valve 512 is completed is received from the part transporting device 50 (S129). If the gate opening notification is not received (S129: No), the controller 22 executes the processing illustrated in step S129 again.

Meanwhile, if the gate opening notification is received (S129: Yes), the controller 22 controls the processing device 40 so as to lift the edge ring 423 by the lift pin 48 and open the gate valve 401 (S130). Then, the controller 22 transmits a replacement start instruction instructing the start of replacement of the edge ring 423 to the part transporting device 50 (S131).

Moreover, after the replacement start instruction is transmitted in step S131, the part transporting device 50 replaces the edge ring 423. In this case, the controller 22 may control the processing device 40 to clean the inside of the chamber 41 of the processing device 40 from the time when the used edge ring 423 is unloaded to the time when the unused edge ring 423 is loaded. Accordingly, when the used edge ring 423 is unloaded, the reaction by-products that are peeled off from the edge ring 423 and fall into the processing device 40 may be removed before the unused edge ring 423 is loaded.

Next, the controller 22 determines whether or not a replacement completion notification is received from the part transporting device 50 (S132). If the replacement completion notification is not received from the part transporting device 50 (S132: No), the controller 22 executes the processing illustrated in step S132 again.

Meanwhile, if the replacement completion notification is received from the part transporting device 50 (S132: Yes), the controller 22 controls the processing device 40 so as to close the gate valve 401 (S133). Then, the controller 22 transmits a replacement confirmation notification to the part transporting device 50 (S134). Then, the controller 22 controls the exhaust system 46 and the valve 461*a* of the processing device 40 to stop the exhaust of the gas in the space 60 of the connection portion between the processing device 40 and the part transporting device 50 (S135). Then, the controller 22 opens the valve 461*b* of the processing device 40 to return the pressure in the space 60 of the connection portion between the processing device 40 and the part transporting device 50 to the atmospheric pressure.

Next, the controller 22 deletes a record including the "part ID" of the used edge ring 423 that has been replaced with the unused edge ring 423 in the reservation table 210. Then, the controller 22 newly creates a record including the "part ID" of the unused edge ring 423 that has been replaced with the used edge ring 423 in the reservation table 210 (S136). In the newly created record, identification information of the processing device 40 in which the edge ring 423 is replaced is registered in a "processing device ID" column, the current date and time are registered in a "replacement date and time" column, and 0 is registered in the "RF integration time" column. Moreover, a "part transporting device ID" column is left blank.

Then, the controller 22 estimates the replacement time of the unused edge ring 423 that has been replaced and registers the estimated replacement time in the "next RF integration time" of the newly created record (S137). Then, the controller 22 executes the processing illustrated in step S120 again.

(Processing of Part Transporting Device 50)

Figure 18A:
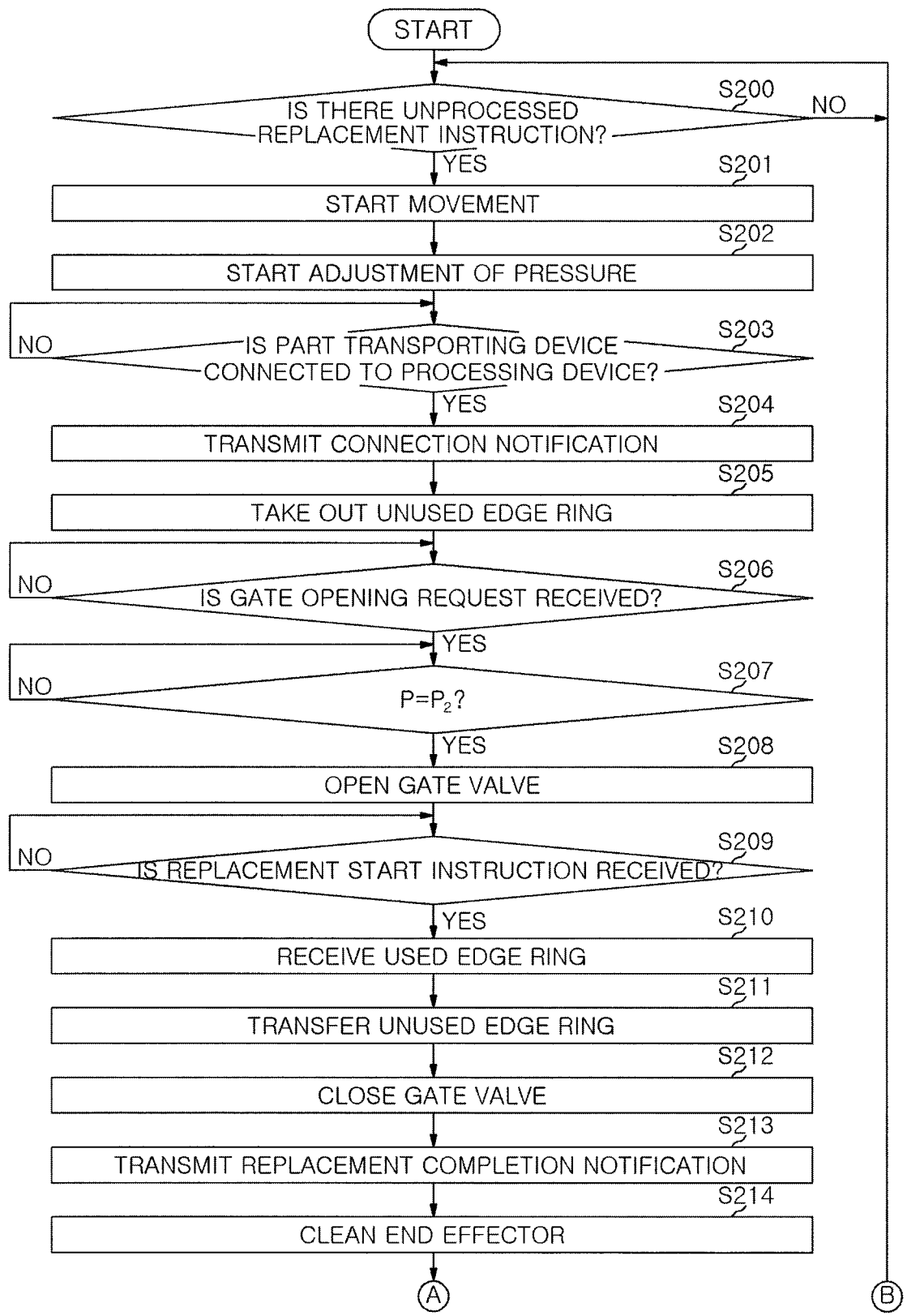
FIGS. 18A and 18B are a flowchart illustrating an example of processing of the part transporting device.
Figure 18B:
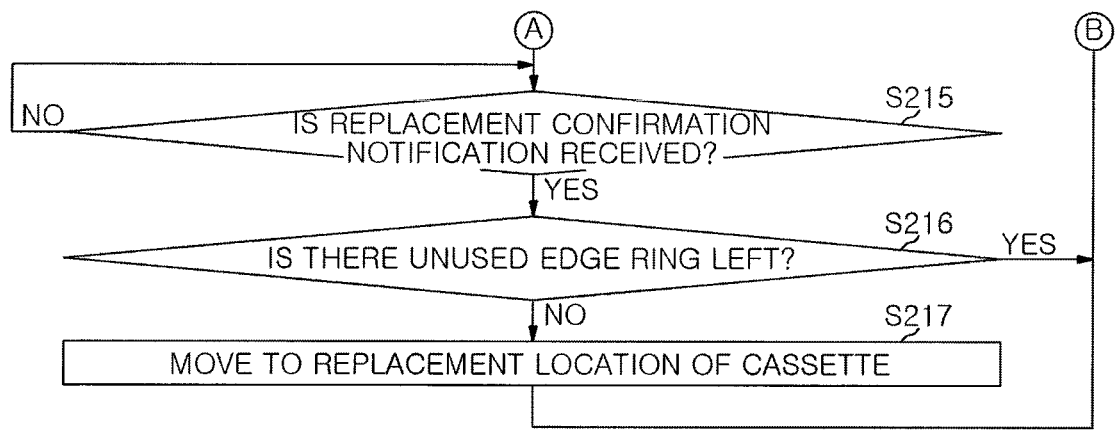

FIGS. 18A and 18B are a flowchart illustrating an example of the processing of the part transporting device 50. The processing illustrated in FIGS. 18A and 18B is realized by the controller 551 executing the program read from the storage unit 552. Moreover, in addition to the processing illustrated in FIGS. 18A and 18B, the controller 551 receives the replacement instruction via the communicator 550 and stores the received replacement instruction in the storage unit 552.

First, the controller 551 determines whether or not there is an unprocessed replacement instruction with reference to the storage unit 552 (S200). If there is no unprocessed replacement instruction (S200: No), the controller 551 executes the processing illustrated in step S200 again.

If there is the unprocessed replacement instruction (S200: Yes), the controller 551 starts the movement of the part transporting device 50 to the position of the processing device 40 corresponding to the position information included in the replacement instruction (S201). Step S201 is an example of a start process. For example, the controller 551 controls the moving mechanism 54 using the sensing result of the sensor 553 to move the part transporting device 50 to the position of the processing device 40 corresponding to the position information included in the replacement instruction. Further, the controller 551 controls the exhaust device 554 and the valve 556*a* to start the exhausting of the gas in the container 51 of the part transporting device 50, and thus starts the adjustment of the pressure in the container 51 (S202).

Next, the controller 551 determines whether or not the part transporting device 50 is connected to the processing device 40 based on the sensing result of the sensor 553 (S203). If the part transporting device 50 is not connected to the processing device 40 (S203: No), the controller 551 executes the processing illustrated in step S203 again.

Meanwhile, if the part transporting device 50 is connected to the processing device 40 (S203: Yes), the controller 551 transmits the connection notification to the control device 20 via the communicator 550 (S204). Then, the controller 551 controls the robot arm 53*a* so as to extract the unused edge ring 423 from the cassette 52 (S205).

Next, the controller 551 determines whether or not the gate opening request is received from the control device 20 via the communicator 550 (S206). If the gate opening request is not received (S206: No), the controller 551 executes the processing illustrated in step S206 again.

Meanwhile, if the gate opening request is received (S206: Yes), the controller 551 determines whether or not the pressure P in the container 51 of the part transporting device 50 becomes the predetermined pressure $P_2$ (S207). The pressure $P_2$ is the same pressure as the adjusted pressure $P_2$ in the space 60 (refer to FIG. 12) of the connection portion after the processing device 40 and the part transporting device 50 are connected to each other. If the pressure P is not the pressure $P_2$ (S207: No), the controller 551 executes the processing illustrated in step S207 again. Step S207 is an example of a preparation process.

Here, when the edge ring 423 is replaced, the pressure inside the chamber 41 of the processing device 40 is controlled to the pressure $P_1$, and the pressure inside the space 60 of the connection portion between the processing device 40 and the part transporting device 50 and the pressure inside the container 51 of the part transporting device 50 are controlled to the pressure $P_2$ that is lower than the pressure $P_1$. Therefore, when the gate valve 401 of the processing device 40 and the gate valve 512 of the part transporting device 50 are opened, a gas flows from the chamber 41 of the processing device 40 into the container 51 of the part transporting device 50. Therefore, the particles in the part transporting device 50 are prevented from entering the processing device 40.

Moreover, when a difference between the pressure $P_1$ in the processing device 40 and the pressure $P_2$ in the connection portion between the processing device 40 and the part transporting device 50 and in the part transporting device 50 is too small, the particles in the part transporting device 50 may enter the processing device 40. On the other hand, when the difference between the pressure $P_1$ and the pressure $P_2$ is too large, the particles may be rolled up in the part transporting device 50. Therefore, for example, the difference between the pressure $P_1$ and the pressure $P_2$ may be in a range from 10 Pa to $10^4$ Pa.

If the pressure P is the pressure $P_2$ (S207: Yes), the controller 551 opens the gate valve 512 (S208). Then, the controller 551 determines whether or not the replacement start instruction is received from the control device 20 via the communicator 550 (S209). If the replacement start instruction is not received (S209: No), the controller 551 executes the processing illustrated in step S209 again.

Meanwhile, if the replacement start instruction is received (S209: Yes), the controller 551 inserts the end effector 530b into the processing device 40 and controls the robot arm 53b so that the robot arm 53b receives the used edge ring 423 lifted by the lift pin 48 (S210). Then, the controller 551 controls the robot arm 53b so that the end effector 530b is retracted into the part transporting device and the used edge ring 423 is accommodated in the cassette 52. Step S210 is an example of an accommodation process.

Next, the controller 551 inserts the end effector 530a, on which the unused edge ring 423 is placed, into the processing device 40 and controls the robot arm 53a so that the robot arm 53a transfers the unused edge ring 423 to the lift pin 48 (S211). Then, the controller 551 controls the robot arm 53a so that the robot arm 53a retracts the end effector 530a into the part transporting device 50. The unused edge ring 423 is placed on the lower electrode 421 as the lift pin 48 is lowered. Step S211 is an example of a loading process.

Next, the controller 551 closes the gate valve 512 (S212). Step S212 is an example of a closing process. Then, the controller 551 transmits the replacement completion notification to the control device 20 via the communicator 550 (S213).

Next, the controller 551 controls the robot arm 53b so that the end effector 530b moves in the vicinity of the cleaning unit 56 and controls the cleaning unit 56 so that the cleaning unit 56 cleans the end effector 530b (S214).

Next, the controller 551 determines whether or not the replacement confirmation notification is received from the control device 20 via the communicator 550 (S215). If the replacement confirmation notification is not received (S215: No), the controller 551 executes the processing illustrated in step S215 again.

Meanwhile, if the replacement confirmation notification is received (S215: Yes), the controller 551 determines whether or not the unused edge ring 423 remains in the cassette 52 (S216). For example, the controller 551 determines whether or not the unused edge ring 423 remains in the cassette 52 based on the number of edge rings 423 accommodated in the cassette 52 and the number of replacements.

If the unused edge ring 423 remains in the cassette 52 (S216: Yes), the controller 551 executes the processing illustrated in step S200 again. Meanwhile, if the unused edge ring 423 does not remain in the cassette 52 (S216: No), the controller 551 controls the moving mechanism 54 so that the moving mechanism 54 moves the part transporting device 50 to the replacement location of the cassette 52. Then, the cassette 52 in the part transporting device 50 and a cassette 52 in which the unused edge ring 423 is accommodated are replaced with each other (S217). Then, the controller 551 executes the processing illustrated in step S200 again.

In the present embodiment, when the unused edge ring 423 does not remain in the cassette 52, the part transporting device 50 moves to the replacement location of the cassette 52 and the cassette 52 is replaced. However, the present disclosure is not limited thereto. For example, an Automated Guided Vehicle (AGV) or the like may transport the cassette 52 accommodating the unused edge ring 423 to the location of the part transporting device 50 to replace the cassette 52.

Further, when the cassette 52 is replaced, the pressure inside the container 51 of the part transporting device 50 is atmospheric pressure, and it takes time to reduce the pressure to the pressure $P_2$ at the time of replacing the edge ring 423. Therefore, when the cassette 52 is replaced, the controller 551 may control the exhaust device 554 to exhaust the gas in the container 51 and may reduce the pressure inside the container 51 to the pressure $P_2$ for the replacement of the edge ring 423. Accordingly, when the replacement instruction is received from the control device 20, the part transporting device 50 may start the replacement of the edge ring 423 more quickly.

Heretofore, the first embodiment is described. As described above, the replacement method according to the present embodiment is the part replacement method in the processing system 10 that includes the processing device 40 for processing the substrate W, the part transporting device for transporting the consumable part provided in the processing device 40, and the control device 20 for controlling the processing device 40 and the part transporting device 50, the control device 20 executing the first estimation process, the specifying process, the second estimation process, the third estimation process, and the transmission process. In the first estimation process, the replacement time of the consumable part of the processing device 40 is estimated. In the specifying process, the timing after the processing of the substrate W performed by the processing device 40 is finally completed in a period before the replacement time is specified as the replaceable timing of the consumable part. In the second estimation process, the first movement time period required for the part transporting device 50 to move to the position of the processing device 40 requiring the replacement of the consumable part is estimated. In the third estimation process, the first preparation time period required for the preparation until the part transporting device 50 that has moved to the position of the processing device 40 requiring the replacement of the consumable part becomes a state in which the consumable part is replaceable is estimated. In the transmission process, the replacement instruction is transmitted to the part transporting device 50 at the timing before the timing that is earlier than the replaceable timing by a total time of the first movement time period and the first preparation time period, and thus, the part transporting device 50 is instructed to replace the consumable part. Accordingly, the downtime of the processing device 40 caused by the replacement of the consumable part can be shortened.

Further, in the above-described embodiment, the part transporting device 50 includes the container 51, the cassette 52, the robot arm 53, the moving mechanism 54, the communicator 550, and the controller 551. The cassette 52 accommodates the unused consumable part and the used consumable part. The container 51 has the opening 511 to be connected to the processing device 40 and the gate valve 512 for opening and closing the opening 511, and the container accommodates the cassette 52. The robot arm 53 extracts the used consumable part from the processing device 40 through the opening 511 to accommodate the used consumable part in the cassette 52. Further, the robot arm 53 extracts the unused consumable part from the cassette 52 to load the unused consumable part into the processing device 40 through the opening 511. The moving mechanism 54 has a power source and moves the part transporting device 50. The communicator 550 performs wireless communication with the control device 20. The controller 551 executes the start process, the preparation process, the accommodation process, the loading process, and the closing process. In the start process, when the replacement instruction is transmitted from the control device 20, the moving mechanism 54 is used to start moving the part transporting device 50 to the position of the processing device 40 requiring the replacement of the consumable part. In the preparation process, after moving to the position of the processing device 40 requiring the replacement of the consumable part, preparation is executed until the consumable part can be replaced. In the accommodation process, at the replaceable timing, the gate valve 512 is opened, and the used consumable part is transferred from the processing device 40 through the opening 511 and accommodated in the cassette 52. In the loading process, the unused consumable part is extracted from the cassette 52 and transferred into the processing device 40 through the opening 511. In the closing process, the gate valve 512 is closed. Accordingly, it is possible to easily replace the consumable part.

Further, in the above-described embodiment, the part transporting device 50 includes the exhaust device 554 that controls a pressure in the container 51. Further, the processing device 40 has the pressure control valve 460 that controls the pressure of the chamber 41 that defines the processing space 41s in the processing device 40. The control device 20 controls the part transporting device 50 and the processing device 40 so that the pressure in the chamber 41 is higher than the pressure in the container 51 at the replaceable timing. Accordingly, when the consumable part is replaced, the particles in the part transporting device 50 are prevented from entering the processing device 40.

Further, in the above-described embodiment, the control device 20 controls the part transporting device 50 and the processing device 40 so that the pressure difference between the pressure in the container 51 and the pressure in the chamber 41 is within the range of 10 Pa to $10^4$ Pa. Accordingly, it is possible to prevent particles from entering the processing device 40 from the part transporting device 50 and particles from scattering in the part transporting device 50 when the consumable part is replaced.

Further, in the above-described embodiment, the control device 20 estimates the replacement time of the consumable part based on at least one of the RF integration time, the RF integration power, the recipe integration time, the change in weight of the consumable part, and the change in dimensions of the consumable part. Accordingly, it is possible to accurately estimate the replacement time of the consumable part.

Further, in the above-described embodiment, the processing system 10 includes the plurality of part transporting devices 50. The control device 20 transmits the replacement instruction to the part transporting device 50 located at the position closest to the processing device requiring the replacement of the consumable part. Accordingly, a moving distance of the part transporting device 50 can be shortened, and thus the consumable part can be replaced more quickly.

Further, in the above-described embodiment, the control device 20 controls the processing device 40 so as to clean the used consumable part before the used consumable part is extracted from the processing device 40. Accordingly, the reaction by-products adhered to the used consumable part can be removed, and the scattering of the reaction by-products when the used consumable part is extracted can be suppressed.

Further, in the above-described embodiment, from the base member on which the used consumable part is placed, the used consumable part is moved to be separated from the base member, and thereafter the control device 20 controls the processing device 40 to clean the used consumable part. Accordingly, it is possible to remove reaction by-products adhered not only to the upper surface of the consumable part but also to the side surface of the consumable part and the surface of the base member on which the consumable part was placed.

Further, in the above-described embodiment, the control device 20 controls the processing device 40 to clean the region inside the processing device 40 in which the used consumable part is disposed from the time when the used consumable part is extracted from the processing device 40 to the time when the unused consumable part is transferred into the processing device 40. Accordingly, when the used consumable part is extracted from the processing device 40, reaction by-products that are peeled off from the consumable part and fall into the processing device 40 can be removed before the unused consumable part is transferred into the processing device 40.

Second Embodiment

In the first embodiment, the exhaust device 554 is provided in the part transporting device 50, and the gas in the part transporting device 50 is exhausted to the outside of the part transporting device 50 by the exhaust device 554, and thus, the pressure inside the part transporting device 50 is reduced. Meanwhile, in the present embodiment, the gas in the part transporting device 50 is exhausted by the exhaust system 46 of the processing device 40 when the part transporting device 50 is connected to the processing device 40. Accordingly, the exhaust device 554 in the part transporting device 50 is unnecessary, and thus, the size of the part transporting device 50 may be reduced. Moreover, since a system configuration of a processing system 10 in the present embodiment is the same as the system configuration of the processing system 10 in the first embodiment described with reference to FIG. 1, descriptions thereof will be omitted.

(Configuration of Processing Device 40)

Figure 19:
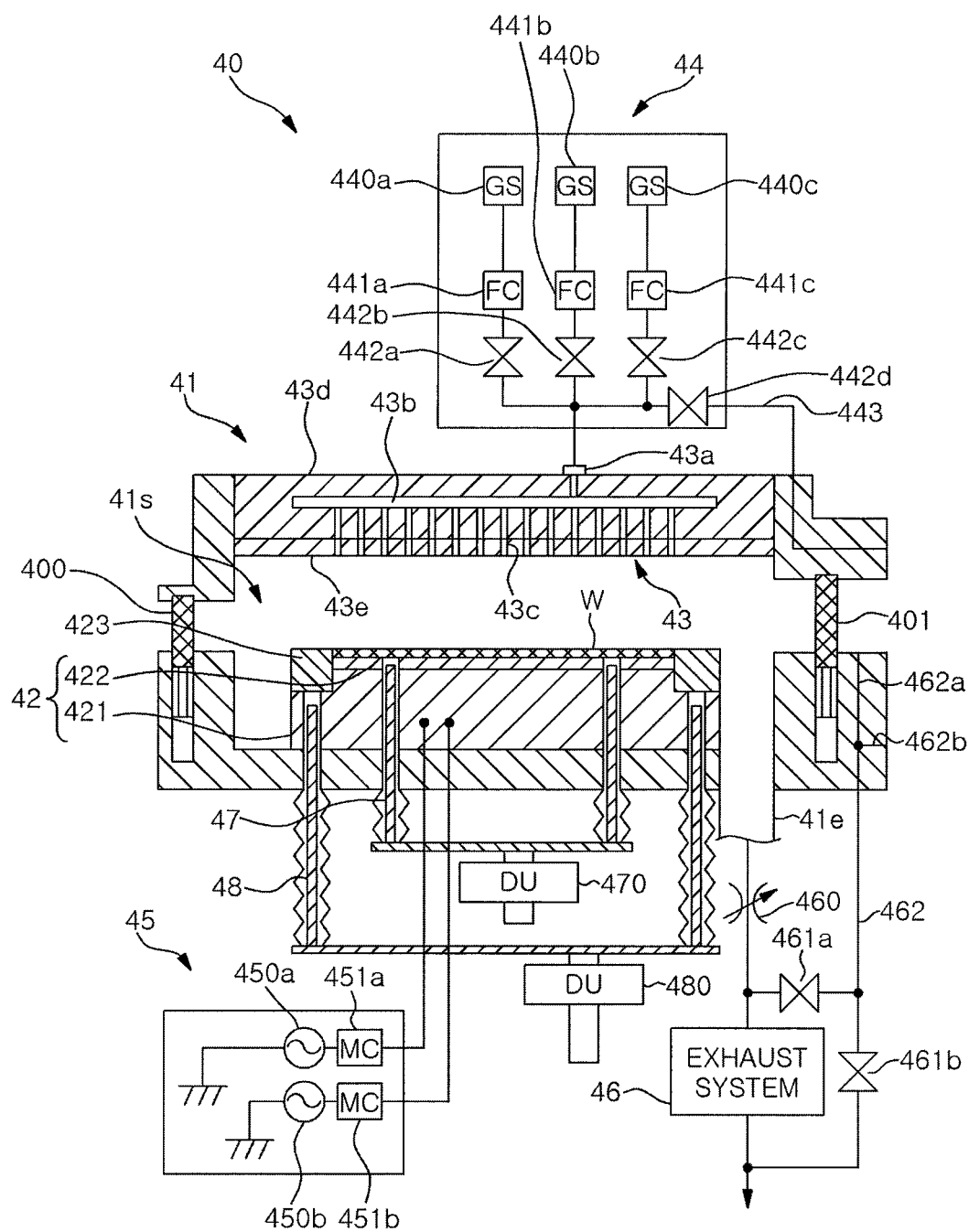
FIG. 19 is a diagram illustrating an example of a processing device according to a second embodiment.

FIG. 19 is a diagram illustrating an example of the processing device 40 according to the second embodiment. Except for points described below, in FIG. 19, configurations having the same reference numerals as those in FIG. 2 have the same functions as the configurations in FIG. 2, and thus, descriptions thereof will be omitted.

The pipe 462 connected between the pressure control valve 460 and the exhaust system 46 is branched into a pipe 462a and a pipe 462b. When the valve 461a is opened, the gas may be exhausted by the exhaust system 46 via the pipes 462a and 462b.

Further, a pipe 443 is provided on a side surface of the chamber 41 where the gate valve 401 is provided. The pipe 443 is connected to the valves 442a to 442c via a valve 442d. By closing the valves 442a and 442b and opening the valves 442c and 442d, it is possible to supply the inert gas having the gas flow controlled by the flow controller 441c into the pipe 443.

(Configuration of Part Transporting Device 50)

Figure 20:
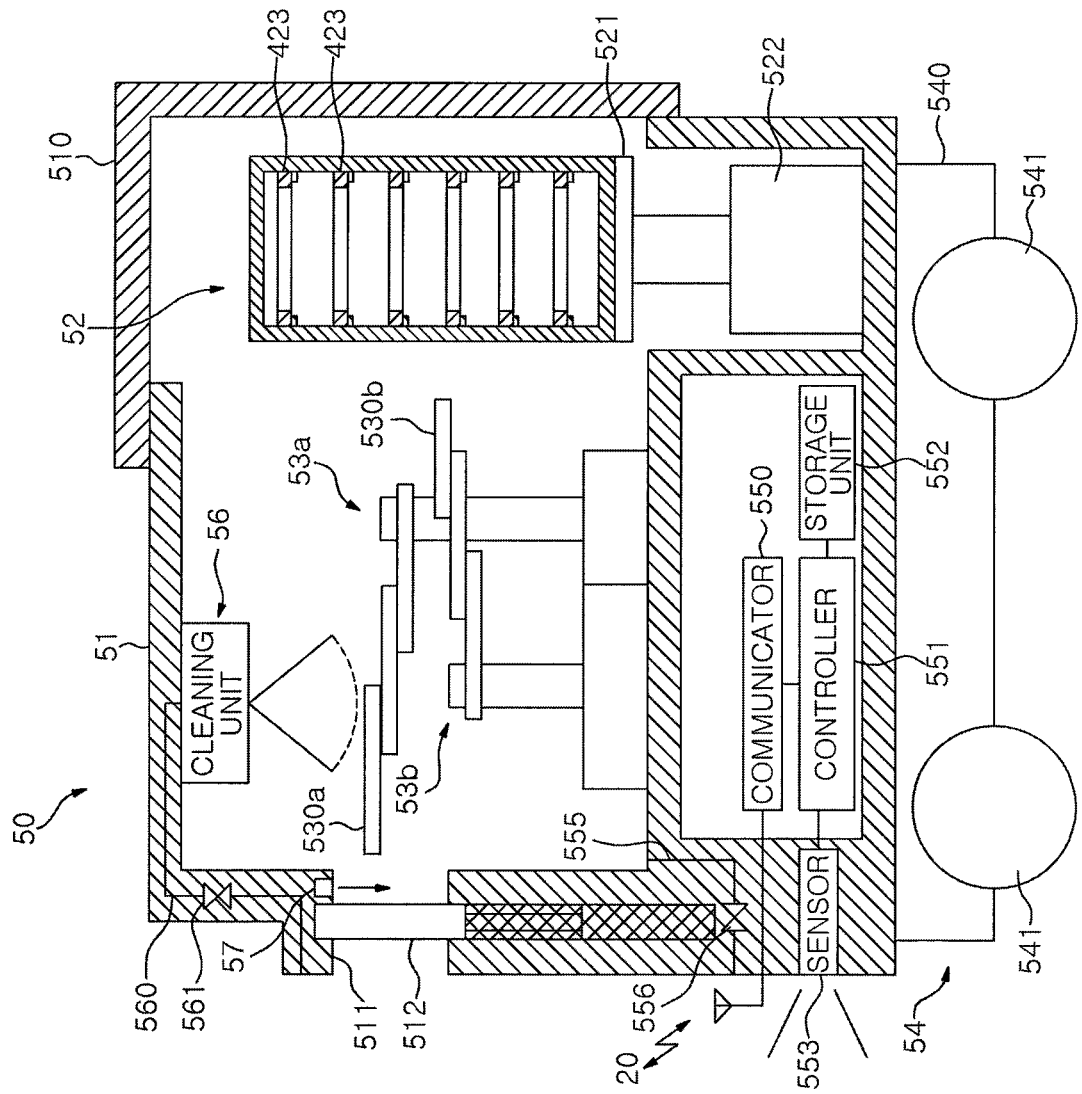
FIG. 20 is a diagram illustrating an example of a part transporting device according to the second embodiment.

FIG. 20 is a diagram illustrating an example of the part transporting device 50 according to the second embodiment. Except for points described below, in FIG. 20, configurations having the same reference numerals as those in FIG. 9 have the same functions as the configurations in FIG. 9, and thus, descriptions thereof will be omitted.

The pipe 555 is disposed between the side surface of the container 51 where the gate valve 512 is provided and the space inside the container 51, and a valve 556 is provided in the pipe 555. In the present embodiment, the exhaust device 554 is not provided in the part transporting device 50. The pipe 555 is an example of an exhaust port.

Further, a pipe 560 is provided on the side surface of the container 51 where the gate valve 512 is provided. The pipe 560 is connected to the cleaning unit 56. A valve 561 is provided in the pipe 560.

(Connection Between Processing Device 40 and Part Transporting Device 50)

Figure 21:
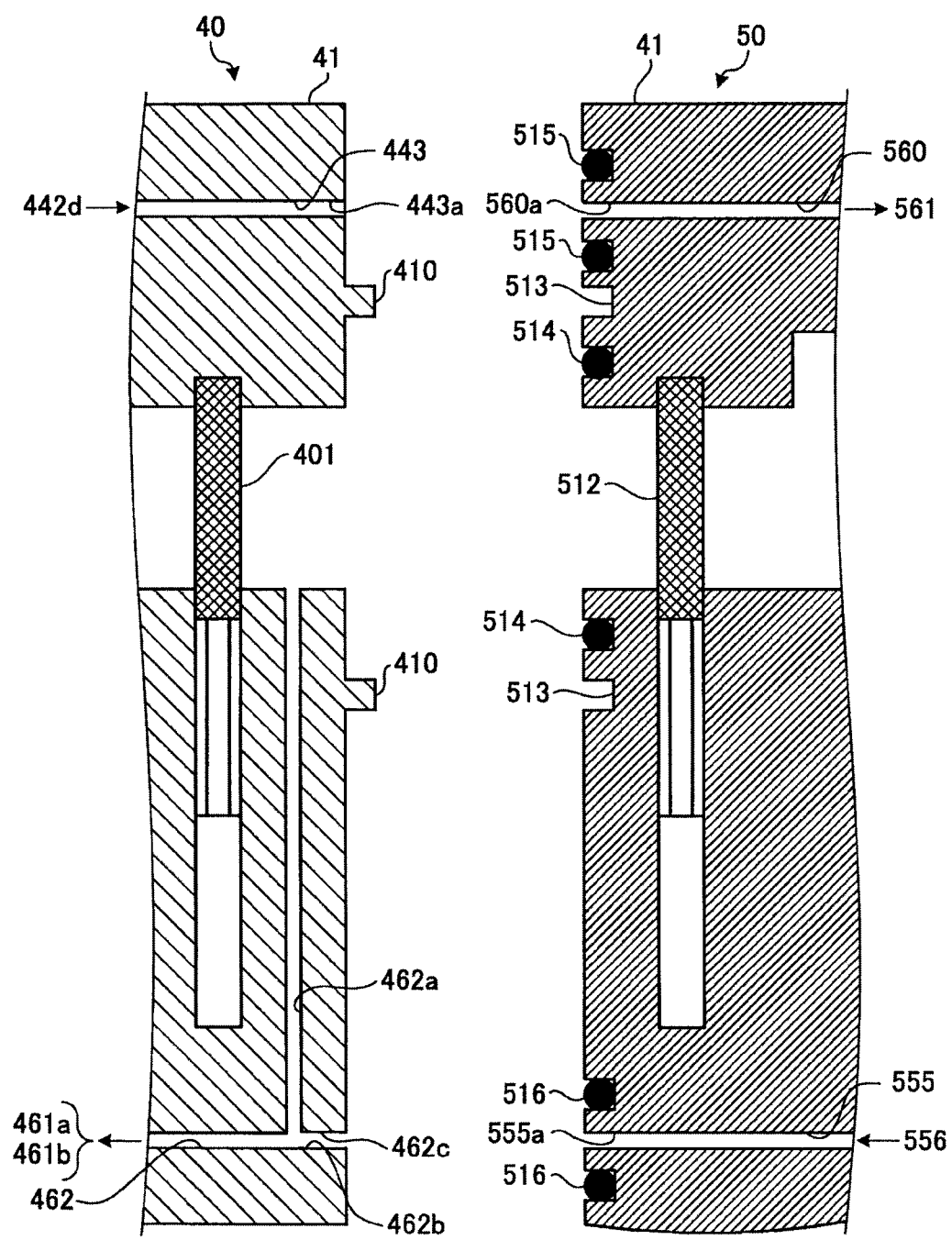
FIG. 21 is an enlarged cross-sectional view illustrating an example of a connection portion between the processing device and the part transporting device according to the second embodiment.

FIG. 21 is an enlarged cross-sectional view illustrating an example of a connection portion between the processing device 40 and the part transporting device 50 according to the second embodiment. Except for points described below, in FIG. 21, configurations having the same reference numerals as those in FIG. 11 have the same functions as the configurations in FIG. 11, and thus, descriptions thereof will be omitted.

An opening 462c of the pipe 462b and an opening 555a of the pipe 555 are formed at positions facing each other when the processing device 40 and the part transporting device 50 are connected to each other. Further, a seal member 516 such as an O-ring is disposed on the side surface of the container 51 of the part transporting device 50 so as to surround the opening 555a. Accordingly, when the processing device 40 and the part transporting device 50 are connected to each other, the pipe 462b and the pipe 555 airtightly communicate with each other.

After the processing device 40 and the part transporting device 50 are connected to each other, the valve 461a of the processing device 40 is opened, the gas is exhausted by the exhaust system 46, and thus, the gas in the container 51 of the part transporting device 50 may be exhausted through the pipes 462b and 555. Accordingly, the pressure inside the container 51 may be reduced without providing the exhaust device 554 in the part transporting device 50, and thus, the size of the part transporting device 50 may be reduced.

Further, an opening 443a of the pipe 443 and an opening 560a of the pipe 560 are formed at positions facing each other when the processing device 40 and the part transporting device 50 are connected to each other. Further, a seal member 515 such as an O-ring is disposed on the side surface of the container 51 of the part transporting device 50 so as to surround the opening 560a. Accordingly, when the processing device 40 and the part transporting device 50 are connected to each other, the pipe 443 and the pipe 560 airtightly communicate with each other.

After the replacement of the edge ring 423 is completed, the valves 442a and 442b of the processing device 40 are closed, the valves 442c and 442d are opened, and the valve 561 of the part transporting device 50 is opened in a state where the processing device 40 and the part transporting device 50 are connected to each other. Accordingly, the inert gas is supplied to the cleaning unit 56 of the part transporting device 50. The cleaning unit 56 cleans the end effector 530b by a high-pressure gas purge using the inert gas supplied through the pipe 560. Accordingly, since it is not necessary to provide the supply source of the inert gas in the part transporting device 50, the size of the part transporting device 50 may be reduced.

Third Embodiment

In the first and second embodiments, the part transporting device 50 replaces the edge ring 423 that is one type of consumable part. Meanwhile, in the present embodiment, the part transporting device 50 replaces a plurality of types of consumable parts. For example, as the plurality of types of consumable parts, there are the edge ring 423 and the upper electrode 43e.

The cassette 52 accommodates unused consumable parts and used consumable parts for the plurality of types of consumable parts. In the present embodiment, the inside of the cassette 52 is divided into the plurality of spaces, each of which accommodates the consumable parts of each type. Accordingly, even when a specific type of consumable part is frequently replaced, it is possible to prevent reaction by-products or the like adhered to the used consumable part of the specific type from falling onto the unused consumable part of another type in the cassette 52. Alternatively, different cassettes 52, each of which accommodates the consumable parts of each type, may be provided, and the different cassettes 52 for the respective types may be accommodated in the part transporting device 50.

Here, different types of consumable parts may have different replacement cycles. Therefore, different types of consumable parts often do not have the same replacement time. When the replacement times do not match with each other, the processing may be stopped and the consumable part may be replaced, and after the processing is restarted, the processing may be stopped again in a short period of time to replace another consumable part. In this case, if the replacement times of a plurality of consumable parts are close to each other, the plurality of consumable parts are replaced while the processing is stopped, so that the processing stop time period may be shortened. Thus, the production efficiency may be improved.

Figure 22:
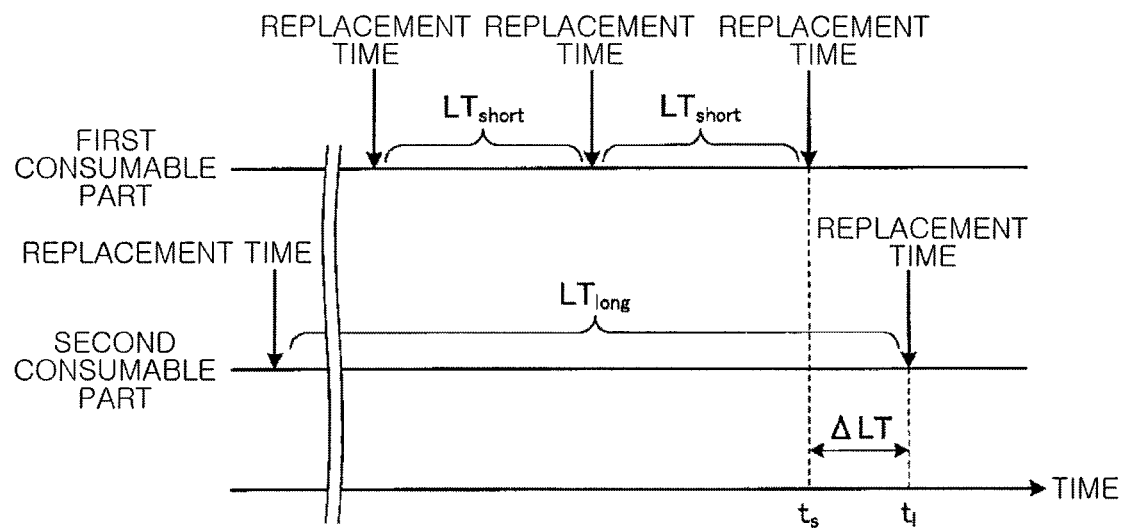
FIG. 22 is a diagram for describing an example of a replacement timing of a consumable part according to a third embodiment.

FIG. 22 is a diagram for describing an example of a replacement timing of a consumable part according to the third embodiment. In the present embodiment, when a time difference $\Delta$LT between a replacement time $t_s$ of a first consumable part having a short replacement cycle $LT_{short}$ and a replacement time $t_1$ of a second consumable part having a long replacement cycle $LT_{long}$ is shorter than the replacement cycle $LT_{short}$, both the first consumable part and the second consumable part are replaced with each other at the replacement time $t_s$. The replacement cycle $LT_{short}$ is an example of a first replacement cycle, and the replacement cycle $LT_{long}$ is an example of a second replacement cycle.

For example, in the control device 20, when the time difference ΔLT between the replacement time $t_s$ of the first consumable part and the replacement time $t_1$ of the second consumable part is shorter than the replacement cycle $LT_{short}$, the replacement of the second consumable part is also instructed in the replacement instruction instructed based on the replacement time $t_s$ of the first consumable part. Therefore, the processing stop time period may be shortened, and the production efficiency may be improved.

Moreover, when replacing consumable parts of different types during one processing downtime, it is preferable to replace a consumable part placed at a higher position first than a consumable part placed at a lower position. For example, the control device 20 instructs the part transporting device 50 to first replace a consumable part provided at a position higher in the processing device 40 between the first consumable part and the second consumable part. Accordingly, it possible to prevent reaction by-products or the like peeled off from a used consumable part from falling onto an unused consumable part that has already been replaced when the used consumable part is unloaded.

Fourth Embodiment

In the first to third embodiments, the part transporting device 50 is connected to the processing device 40 that requires the replacement of the consumable part, and the consumable part in the processing device 40 is replaced. Meanwhile, in the present embodiment, when the replacement times of the consumable parts in the plurality of processing devices 40 come closer, the part transporting device 50 may replace the consumable part in another processing device 40 through the vacuum transfer chamber 31 in a state where the part transporting device 50 is connected to one processing device 40. Accordingly, a downtime of the processing system 10 caused by the replacement of the consumable part may be shortened.

Figure 23:
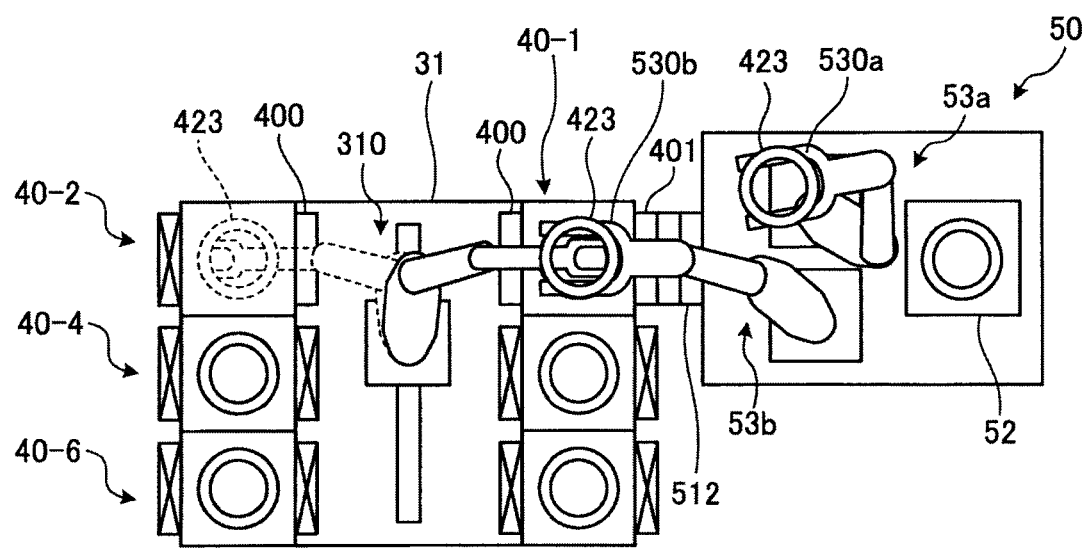
FIG. 23 is a diagram for describing an example of a method for replacing an edge ring according to a fourth embodiment.

FIG. 23 is a diagram for describing an example of a method of replacing an edge ring 423 according to the fourth embodiment. FIG. 23 illustrates an example in which an edge ring 423 of a processing device 40-1 is replaced and an edge ring 423 of a processing device 40-2 is replaced via the processing device 40-1. The processing device 40-1 is an example of a first processing device, and the processing device 40-2 is an example of a second processing device.

In the present embodiment, the control device 20 estimates a movement time period required for the part transporting device 50 to move from a position of the processing device 40-1 to a position of the processing device 40-2 based on position information of the processing device 40-1 and information of a movable route of the part transporting device 50. The movement time period required for the part transporting device 50 to move from the position of the processing device 40-1 to the position of the processing device 40-2 is an example of a second movement time period.

Further, the control device 20 estimates a preparation time period required for the preparation until the part transporting device 50 that has moved to the position of the processing device 40-2 has a state in which the edge ring 423 in the processing device 40-2 is replaceable. The preparation time period required for the preparation until the part transporting device 50 that has moved to the position of the processing device 40-2 has a state in which the edge ring 423 in the processing device 40-2 is replaceable is an example of a second preparation time period.

Further, the control device 20 estimates a replacement time period required for replacing the edge ring 423 in the processing device 40-2 via the processing device 40-1 and the vacuum transfer chamber 31. Then, when a total time period of the estimated movement time period and the estimated preparation time period is longer than the estimated replacement time period, the control device 20 instructs the part transporting device 50 to replace the edge ring 423 in the processing device 40-2 via the processing device 40-1 and the vacuum transfer chamber 31. Accordingly, the downtime of the processing system 10 caused by the replacement of the consumable part may be shortened.

In the example of FIG. 23, the edge ring 423 in the processing device 40-2 located at a position facing the processing device 40-1 via the vacuum transfer chamber 31 is replaced via the processing device 40-1 and the vacuum transfer chamber 31. However, the present disclosure is not limited thereto. For example, the processing device 40 in which the edge ring 423 is replaced via the processing device 40-1 and the vacuum transfer chamber 31 may be a processing device 40 other than the processing device 40-2, such as a processing device 40-4.

Further, when the edge ring 423 of another processing device 40 is replaced via the processing device 40, it is preferable that the edge ring 423 of another processing device 40 is replaced before the edge ring 423 of the processing device 40, to which the part transporting device 50 is connected, is replaced. For example, when the total time period of the estimated movement time period and the estimated preparation time period is longer than the estimated replacement time period, the control device 20 instructs the part transporting device 50 to replace the edge ring 423 in the processing device 40-2 before the edge ring 423 in the processing device 40-1 is replaced. Accordingly, it is possible to prevent the reaction by-product or the like peeled off from the used edge ring 423 unloaded from another processing device 40 from falling onto the unused edge ring 423 placed on the processing device 40 to which the part transporting device 50 is connected.

Fifth Embodiment

In the part transporting device 50 according to the first to fourth embodiments, when the consumable part is replaced, the gas in the container 51 in which the cassette 52 and the robot arm 53 are accommodated is exhausted, and thus, the pressure in the container 51 is reduced. Meanwhile, in the present embodiment, in the container 51, a space in which the robot arm 53 is accommodated is airtightly partitioned from a space in which the cassette 52 is accommodated by a gate valve, and the gas in the space in which the robot arm 53 is accommodated is exhausted. Accordingly, the size of the space for decompression when replacing the consumable part may be reduced, and thus, a time period required for reducing the pressure to a predetermined pressure may be shortened.

Figure 24:
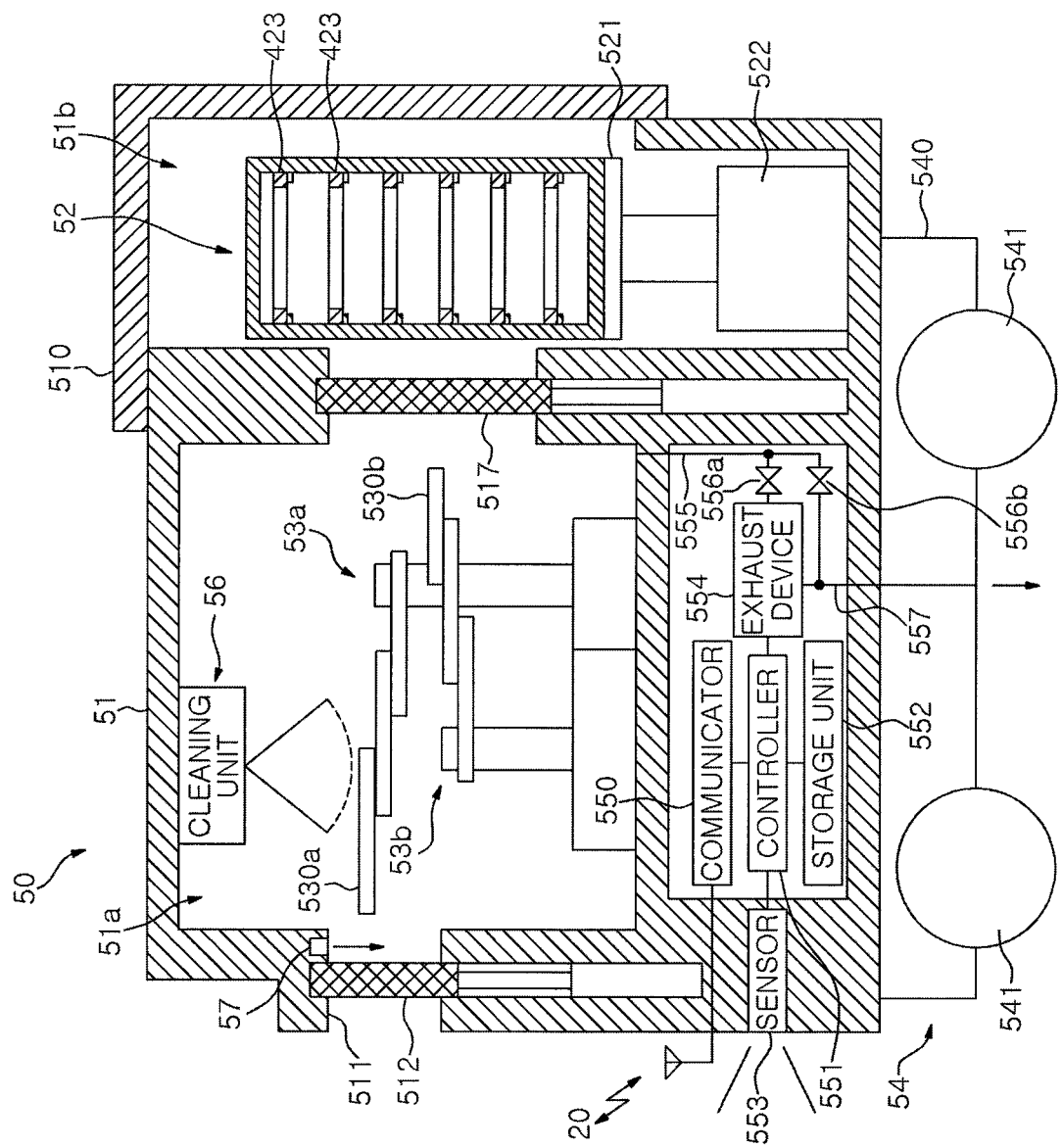
FIG. 24 is a diagram illustrating an example of a part transporting device according to a fifth embodiment.

FIG. 24 is a diagram illustrating an example of the part transporting device 50 according to the fifth embodiment. Except for points described below, in FIG. 24, configurations having the same reference numerals as those in FIG. 9 have the same functions as the configurations in FIG. 9, and thus, descriptions thereof will be omitted.

In the container 51, a space 51a in which the robot arms 53a and 53b are accommodated is airtightly partitioned from a space 51b in which the cassette 52 is accommodated by a gate valve 517. When the edge ring 423 is replaced, the gate valve 517 is opened and the robot arm 53a extracts the unused edge ring 423 from the cassette 52. Then, after the robot arm 53a is retracted into the space 51a, the gate valve 517 is closed. Then, the gas in the space 51a is exhausted by the exhaust device 554. By closing the gate valve 517, the space exhausted by the exhaust device 554 is reduced, and the time period required to reduce the pressure to a predetermined pressure may be shortened. In the container 51, the space 51a defined with the gate valve 512 and the gate valve 517 is an example of a load lock chamber.

Then, after the pressure in the space 51a is reduced to the predetermined pressure, the gate valve 512 is opened and the edge ring 423 is replaced. Then, after the replacement of the edge ring 423 is completed and the gate valve 512 is closed, the pressure in the space 51a is returned to the atmospheric pressure and the gate valve 517 is opened. Then, the used edge ring 423 is accommodated in the cassette 52 by the robot arm 53b.

Then, after the robot arm 53b is retracted into the space 51a, the gate valve 517 is closed again. Then, the exhaust device 554 exhausts the gas in the space 51a, and the cleaning unit 56 cleans the end effector 530b. By closing the gate valve 517 while the end effector 530b is cleaned, it is possible to prevent particles scattered by the cleaning from adhering to the unused edge ring 423 accommodated in the cassette 52.

Other Embodiments

The present disclosure is not limited to the above-described embodiments, and various modifications may be made within the scope of the gist thereof.

For example, in the first embodiment and the third to fifth embodiments described above, the part transporting device 50 starts exhausting the gas inside the container 51 after receiving the replacement instruction from the control device 20, but the present disclosure is not limited thereto. For example, even before the part transporting device 50 receives the replacement instruction, the part transporting device 50 may control the pressure inside the container 51 so that the pressure inside the container 51 becomes the predetermined pressure $P_2$. Accordingly, when the part transporting device 50 receives the replacement instruction from the control device 20, the part transporting device 50 may start replacing the consumable part more quickly.

Further, in the first embodiment and the third to fifth embodiments described above, the gas exhausted by the exhaust device 554 is discharged to the outside of the part transporting device 50 via the exhaust port 557, but the present disclosure is not limited thereto. For example, the exhaust port 557 and an exhaust gas processing device provided outside the part transporting device 50 may be connected by a flexible hose. Accordingly, the recycling of the gas exhausted from the part transporting device 50 is promoted.

Further, in the first embodiment and the third to fifth embodiments described above, the inside of the container 51 of the part transporting device 50 may be connected to an exhaust device provided outside the part transporting device 50 via a flexible hose, and the gas in the container 51 may be exhausted by the exhaust device. Accordingly, it is not necessary to provide the exhaust device 554 in the part transporting device 50, and thus, the size of the part transporting device 50 can be reduced.

Further, in the second embodiment described above, the gas in the container 51 of the part transporting device 50 is exhausted by the exhaust system 46 of the processing device 40, but the present disclosure is not limited thereto. For example, when the processing device 40 and the part transporting device 50 are connected to each other, the exhaust port 557 of the part transporting device 50 may be connected to the exhaust port of the exhaust system 46. In this case, the gas exhausted by the exhaust device 554 of the part transporting device 50 is exhausted to the exhaust port of the exhaust system 46. Accordingly, the recycling of the gas exhausted from the part transporting device 50 is promoted.

Further, in the fifth embodiment described above, for example, the gas in the space 51a defined with the gate valves 512 and 517 may be exhausted by the exhaust system 46 in the processing device 40 after the processing device 40 and the part transporting device 50 are connected to each other, as in the second embodiment.

Further, in each of the above-described embodiments, the control device 20 controls each processing device 40 and each part transporting device 50 for the replacement of the consumable part, but the present disclosure is not limited thereto. For example, a control function related to the replacement of the consumable part may be realized using any one of a plurality of part transporting devices 50 as a representative part transporting device 50. In this case, the representative part transporting device 50 controls each processing device 40 and manages a state of each processing device for the replacement of the consumable part via the control device 20. Further, the representative part transporting device 50 may directly communicate with each of other part transporting devices 50 without using the control device 20 to control each of other part transporting devices 50 or manage the state of each of other part transporting devices 50.

Further, in the above-described embodiments, the used consumable part is unloaded from the inside of the processing device 40 and the unused consumable part is loaded into the processing device 40 by the same part transporting device 50. However, the present disclosure is not limited thereto. For example, a part transporting device 50 that extracts the used consumable part from the processing device 40 and a part transporting device 50 that transfers the unused consumable part into the processing device 40 may be prepared separately. Therefore, both the unused consumable part and the used consumable part are not accommodated in the same part transporting device 50, and thus, it is possible to prevent the unused edge ring 423 from being contaminated by the reaction by-products or the like peeled off from the used edge ring 423.

Further, in this case, the part transporting device 50 that transfers the unused consumable part into the processing device 40 may be connected to the vacuum transfer chamber 31 or the atmosphere transfer chamber 33. The part transporting device 50 connected to the vacuum transfer chamber 31 delivers the unused consumable part to the robot arm 310 in the vacuum transfer chamber 31. The robot arm 310 transfers the received unused consumable parts into the processing device 40 requiring the replacement of the consumable part. Further, the part transporting device 50 connected to the atmosphere transfer chamber 33 delivers the unused consumable part to the robot arm 330 in the atmosphere transfer chamber 33. The robot arm 330 transfers the unused consumable part into the load lock chamber 32. The unused consumable part transferred into the load lock chamber 32 is transferred into the processing device 40 requiring the replacement of the consumable part by the robot arm 310 in the vacuum transfer chamber 31. When the part transporting device 50 is connected to the atmosphere transfer chamber 33, it is not necessary to provide the exhaust device in the part transporting device 50 that transports the unused consumable part, and thus, the size of the part transporting device 50 may be reduced.

Further, in each of the above-described embodiments, when the part transporting device 50 is connected to the processing device 40, the battery in the moving mechanism 54 may be charged by power supplied from the processing device 40.

Further, in each of the above-described embodiments, the part transporting device 50 controls the moving mechanism 54 using the sensing result of the sensor 553 to autonomously move the part transporting device 50 to the position of the processing device 40 instructed by the control device 20. However, the present disclosure is not limited thereto. For example, the part transporting device 50 may move the part transporting device 50 by control of a user. In this case, the part transporting device 50 may notify the user of the position of the processing device 40 and the movement route thereof instructed by the control device 20 by displaying the position of the processing device 40 and the movement route thereof on a display device or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A processing system comprising:
a processing device configured to process a substrate;
a part transporting device configured to transport a consumable part positioned in the processing device; and
a control device configured to control the processing device and the part transporting device,
wherein the control device executes:
a first estimation process of estimating a replacement time of the consumable part of the processing device;
a specifying process of specifying a timing after processing of the substrate performed by the processing device is completed in a period before the replacement time as a replaceable timing of the consumable part;
a second estimation process of estimating a first movement time period required for the part transporting device to move to a position of the processing device requiring replacement of the consumable part;
a third estimation process of estimating a first preparation time period required for preparation until the part transporting device that has moved to the position of the processing device requiring the replacement of the consumable part reaches a state in which the consumable part is replaceable; and
a transmission process of transmitting a replacement instruction to the part transporting device at a timing before a timing that is earlier than the replaceable timing by a total time of the first movement time period and the first preparation time period, and instructing the part transporting device to replace the consumable part.

2. The processing system of claim 1, wherein the part transporting device includes
a part housing configured to accommodate an unused consumable part and a used consumable part,
a first container having an opening to be connected to the processing device and an on/off valve configured to open and close the opening, the first container being configured to accommodate the part housing,
a robot arm configured to transfer the used consumable part from the processing device through the opening to accommodate the used consumable part in the part housing, and transfer the unused consumable part from the part housing to load the unused consumable part into the processing device through the opening,
a moving mechanism having a power source and configured to move the part transporting device,
a communicator configured to perform wireless communication with the control device, and
a controller,
wherein the controller executes:
a start process of controlling the moving mechanism and starting to move the part transporting device to the position of the processing device requiring the replacement of the consumable part when the replacement instruction is transmitted from the control device,
a preparation process of executing preparation until the consumable part is replaceable after moving the part transporting device to the position of the processing device requiring the replacement of the consumable part,
an accommodation process of opening the on/off valve, transferring the used consumable part from the processing device through the opening, and accommodating the used consumable part in the part housing at the replaceable timing,
a loading process of extracting the unused consumable part from the part housing, and transferring the unused consumable part into the processing device through the opening, and
a closing process of closing the on/off valve.

3. The processing system of claim 2, wherein the part transporting device includes a first pressure controller configured to control a pressure in the first container,
the processing device includes a second pressure controller configured to control a pressure in a second container that defines a processing space in the processing device, and
the control device controls the part transporting device and the processing device so that the pressure in the second container is higher than the pressure in the first container at the replaceable timing.

4. The processing system of claim 3, wherein the control device controls the part transporting device and the processing device so that a pressure difference between the pressure in the first container and the pressure in the second container is within a range of 10 Pa to $10^4$ Pa.

5. The processing system of claim 1, wherein the control device estimates the replacement time based on at least one of an RF integration time that is an integration time of processing executed in the processing device using RF power, RF integration power that is a multiplication value of a processing time executed in the processing device using the RF power and a value of power, a recipe integration time that is an integration time of a specific processing recipe in which the consumable part is consumed in a predetermined amount, a change in weight of the consumable part, and a change in dimensions of the consumable part.

6. The processing system of claim 1, wherein the consumable part and an additional consumable part are positioned in the processing device, the consumable part has a first replacement cycle and the additional consumable part has a second replacement cycle longer than the first replacement cycle, and when a time difference between a replacement time of the consumable part and a replacement time of the additional consumable part is shorter than the first replacement cycle, the control device instructs the replacement of the additional consumable part in response to the replacement instruction instructed based on the replacement time of the consumable part.

7. The processing system of claim 6, wherein the control device instructs the part transporting device to first replace the one of the consumable part and the additional consumable part that is at a higher position in the processing device.

8. The processing system of claim 1, comprising: a plurality of part transporting devices, each of which is the part transporting device of claim 1, and the control device transmits the replacement instruction to one of the part transporting devices that is located at a position closest to the processing device requiring the replacement of the consumable part.

9. The processing system of claim 1, comprising: the processing device, and an additional processing device having a consumable part, and a transfer chamber connected to each of the processing device and the additional processing device, and when a total time period of a second movement time period required for the part transporting device to move from the position of the processing device to a position of the additional processing device and a second preparation time period required for preparation until the part transporting device that has moved to the position of the additional processing device reaches a state in which the consumable part in the additional processing device is replaceable is obtained and the total time period is longer than a replacement time period during which the consumable part in the additional processing device is replaced through the processing device and the transfer chamber, the control device instructs the part transporting device to replace the consumable part in the additional processing device through the processing device and the transfer chamber.

10. The processing system of claim 9, wherein when the total time period of the second movement time period and the second preparation time period is longer than the replacement time period, the control device instructs the part transporting device to replace the consumable part in the additional processing device before the consumable part in the processing device.

11. The processing system of claim 2, wherein the control device controls the processing device to clean the used consumable part before the used consumable part is extracted from the processing device.

12. The processing system of claim 11, wherein, from a base member on which the used consumable part is placed, the used consumable part is moved to be separated from the base member, and thereafter the control device controls the processing device to clean the used consumable part.

13. The processing system of claim 2, wherein the control device controls the processing device to clean a region inside the processing device in which the used consumable part is disposed, from a time when the used consumable part is extracted from the processing device to a time when the unused consumable part is transferred into the processing device.

14. A part replacement method in a processing system including a processing device configured to process a substrate; a part transporting device configured to transport a consumable part positioned in the processing device; and a control device configured to control the processing device and the part transporting device, the part replacement method executed by the control device comprising:

a first estimation process of estimating a replacement time of the consumable part of the processing device;

a specifying process of specifying a timing after processing of the substrate performed by the processing device is completed in a period before the replacement time as a replaceable timing of the consumable part;

a second estimation process of estimating a first movement time period required for the part transporting device to move to a position of the processing device requiring replacement of the consumable part;

a third estimation process of estimating a first preparation time period required for preparation until the part transporting device that has moved to the position of the processing device requiring the replacement of the consumable part reaches a state in which the consumable part is replaceable; and a transmission process of transmitting a replacement instruction to the part transporting device at a timing before a timing that is earlier than the replaceable timing by a total time of the first movement time period and the first preparation time period, and instructing the part transporting device to replace the consumable part.

* * * * *